(12) United States Patent
Ho

(10) Patent No.: US 12,324,196 B2
(45) Date of Patent: Jun. 3, 2025

(54) SEMICONDUCTOR DEVICE AND METHOD

(71) Applicant: Taiwan Semiconductor Manufacturing Co., Ltd., Hsinchu (TW)

(72) Inventor: Po-Hsun Ho, Kaohsiung (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 410 days.

(21) Appl. No.: 17/663,355

(22) Filed: May 13, 2022

(65) Prior Publication Data

US 2023/0282739 A1  Sep. 7, 2023

Related U.S. Application Data

(60) Provisional application No. 63/268,868, filed on Mar. 4, 2022.

(51) Int. Cl.
| | | |
|---|---|---|
| H10D 48/36 | (2025.01) | |
| H01L 21/02 | (2006.01) | |
| H10D 30/67 | (2025.01) | |
| H10D 62/80 | (2025.01) | |
| H10D 84/85 | (2025.01) | |
| H10D 99/00 | (2025.01) | |

(52) U.S. Cl.
CPC ..... *H10D 48/362* (2025.01); *H01L 21/02568* (2013.01); *H01L 21/02614* (2013.01); *H10D 30/6713* (2025.01); *H10D 30/6757* (2025.01); *H10D 62/80* (2025.01); *H10D 84/85* (2025.01); *H10D 99/00* (2025.01)

(58) Field of Classification Search
CPC .............. H10D 30/481; H10D 30/017; H10D 30/6757; H10D 30/47; H10D 30/031; H10D 84/85; H10D 64/251; H01L 21/02568
See application file for complete search history.

(56) References Cited

U.S. PATENT DOCUMENTS

| | | | |
|---|---|---|---|
| 2014/0021446 A1* | 1/2014 | Lee | ..................... H10D 30/6757 257/29 |
| 2019/0157272 A1* | 5/2019 | Oishi | ..................... H10D 62/82 |
| 2019/0378715 A1* | 12/2019 | Lin | ..................... H01L 21/02521 |

(Continued)

FOREIGN PATENT DOCUMENTS

TW    I744188 B    10/2021

OTHER PUBLICATIONS

JP Office Action in patent family (Year: 2023).*

(Continued)

*Primary Examiner* — Alia Sabur
(74) *Attorney, Agent, or Firm* — Slater Matsil, LLP

(57) ABSTRACT

A device includes a first source/drain region including: a first metal layer including a first metal; and a conductive two-dimensional material on the first metal layer; an isolation layer physically contacting a sidewall of the first metal layer, wherein the conductive two-dimensional material protrudes above the isolation layer; a two-dimensional semiconductor material on the isolation layer, wherein a sidewall of the two-dimensional semiconductor material physically contacts a sidewall of the conductive two-dimensional material; and a gate stack on the two-dimensional semiconductor material.

20 Claims, 22 Drawing Sheets

(56) References Cited

U.S. PATENT DOCUMENTS

| | | | |
|---|---|---|---|
| 2020/0006541 A1* | 1/2020 | Lin | H01L 21/02645 |
| 2020/0243676 A1* | 7/2020 | Tomida | H01L 29/66643 |
| 2021/0226010 A1* | 7/2021 | Lee | H01L 29/7391 |
| 2021/0305378 A1* | 9/2021 | Seol | H10D 30/6729 |
| 2021/0376133 A1 | 12/2021 | Hung et al. | |
| 2022/0102495 A1* | 3/2022 | Maxey | H01L 29/78681 |
| 2023/0141367 A1* | 5/2023 | Sun | G03F 7/162 430/22 |

OTHER PUBLICATIONS

Kong, Desheng et al., "Synthesis of MoS2 and MoSe2 Films with Vertically Aligned Layers," Nano Letters, ACS Publications, Mar. 13, 2013, pp. 1341-11347.

Lin, Hulhui et al., "Growth of Environmentally Stable Transition Metal Selenide Films," Nature Materials Articles, https://doi.org/10.1038/s41563-019-0321-8, 2019, pp. 1-7.

Liu, Xiaochi et al., "Fermi Level Pinning Dependent 2D Semiconductor Devices: Challenges and Prospects," Advanced Materials Apr. 2022, pp. 1-25.

Yeh, Chao-Hui et al., "Graphene-Transition Metal Dichalocogenide Heterojunctions for Scalable and Low-Power Complementary Integrated Circuits," Jan. 14, 2020, pp. 985-992.

Yoo, H. et al. "Recent Advances in Electrical Doping of 2D Semiconductor Materials: Methods, Analyses, and Applications," Nanomaterials, MDPI, Mar. 22, 2021, pp. 1-21.

* cited by examiner

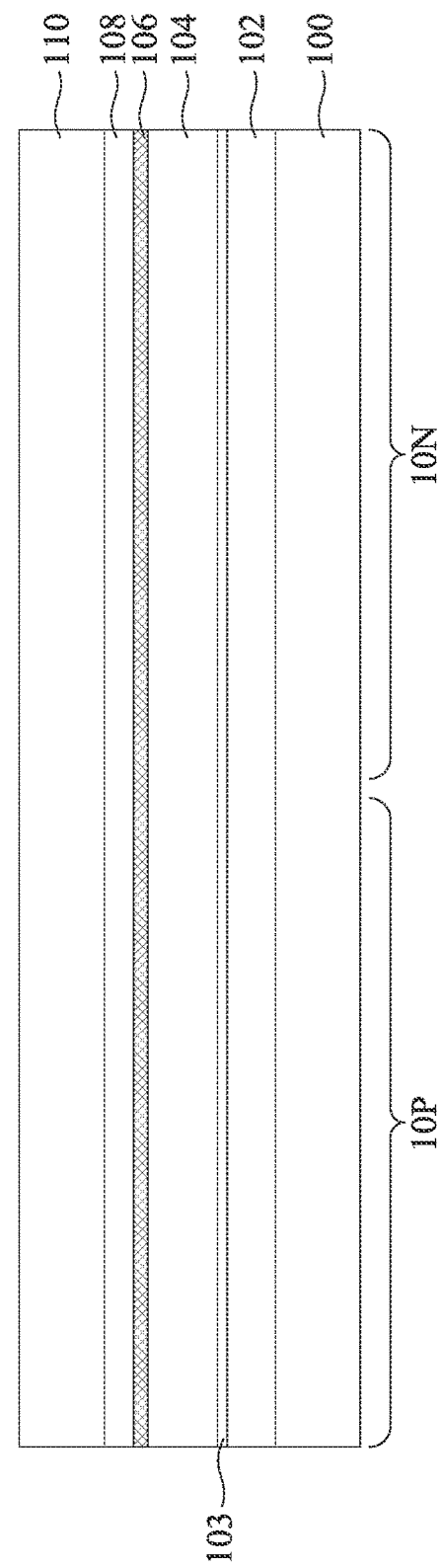

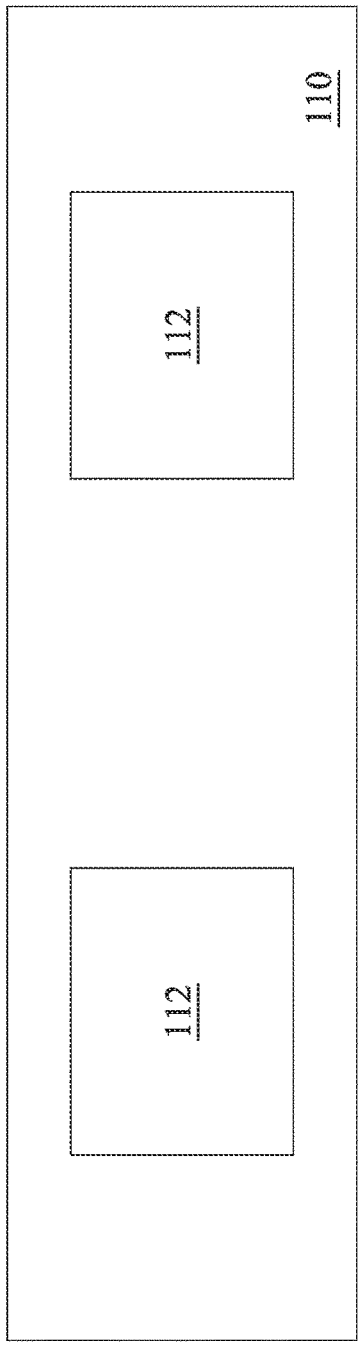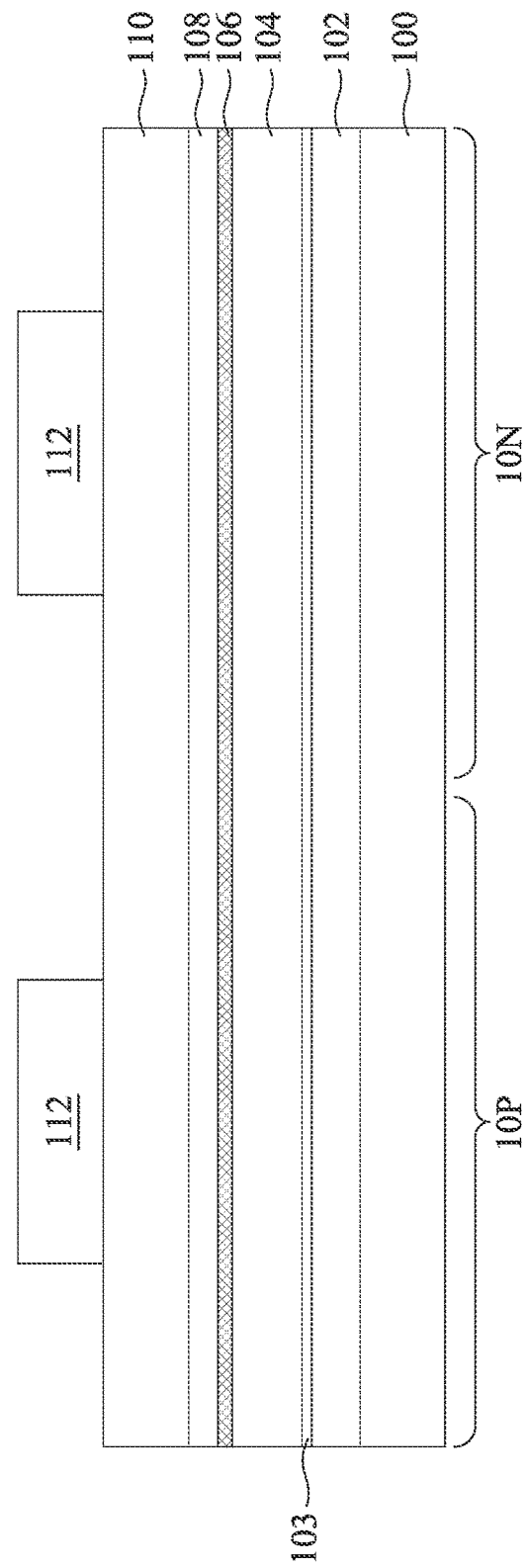
Fig. 3A
Fig. 3B

SEMICONDUCTOR DEVICE AND METHOD

PRIORITY CLAIM AND CROSS-REFERENCE

This application claims the benefit of the U.S. Provisional Application No. 63/268,868, filed on Mar. 4, 2022, which application is hereby incorporated herein by reference.

BACKGROUND

Semiconductor devices are used in a variety of electronic applications such as personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography processes to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1A, 1B, 2A, 2B, 3A, 3B, 4A, 4B, 5A, 5B, 6A, 6B, 7A, 7B, 8A, 8B, 9A, 9B, 10A, 10B, 11A, 11B, 12A, 12B, 13A, and 13B illustrate the top views and cross-sectional views of intermediate stages in the formation of a transistor device, in accordance with some embodiments.

DETAILED DESCRIPTION

Figure 1A:
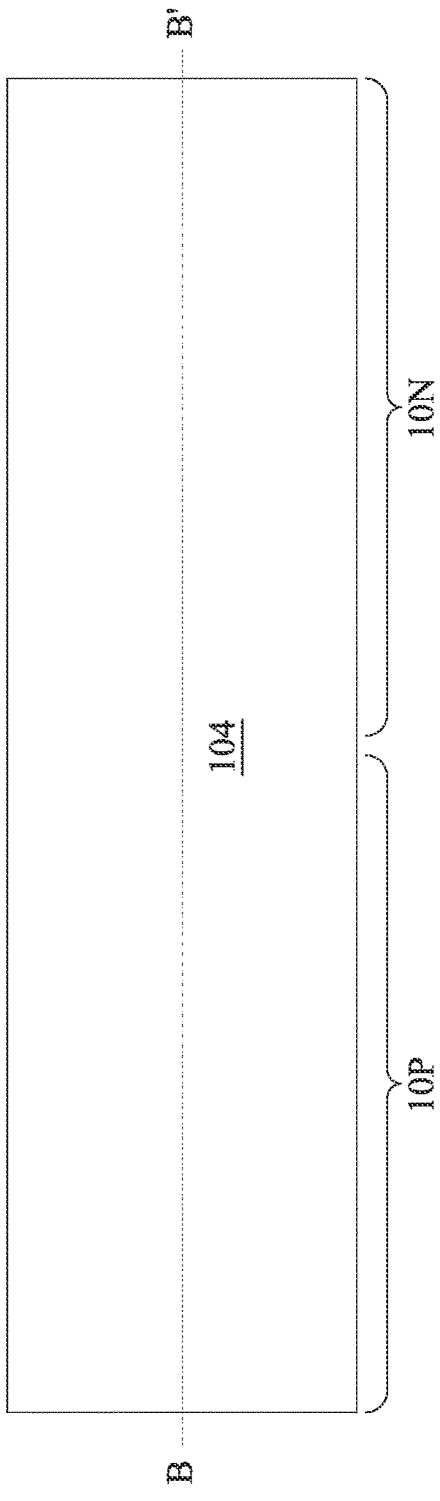

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The embodiments discussed herein are to provide examples to enable making or using the subject matter of this disclosure, and a person having ordinary skill in the art will readily understand modifications that can be made while remaining within contemplated scopes of different embodiments. Throughout the various views and illustrative embodiments, like reference numbers are used to designate like elements. Although method embodiments may be discussed as being performed in a particular order, other method embodiments may be performed in any logical order.

In some embodiments, a transistor device is formed by forming a two-dimensional (2D) channel layer over an isolation layer. Source/drain regions are formed embedded in the isolation layer adjacent the 2D channel layer. The source/drain regions make electrical contact to the sidewalls of the 2D channel layer, which can allow for reduced contact resistance between the source/drain regions and the 2D channel layer. In some embodiments, the source/drain regions include a conductive contact layer over a metal, in which the contact layer physically and electrically contacts the sidewalls of the 2D channel layer. In some embodiments, the conductive contact layer is a 2D material. In some embodiments, a doping layer is formed over the conductive contact layer to provide doping to the 2D material of the conductive contact layer. In this manner, self-aligned contacts to a 2D channel layer may be formed that have reduced contact resistance. Additionally, the techniques described herein allow for less risk of damage or contamination of the 2D channel layer.

FIGS. 1A, 1B, 2A, 2B, 3A, 3B, 4A, 4B, 5A, 5B, 6A, 6B, 7A, 7B, 8A, 8B, 9A, 9B, 10A, 10B, 11A, 11B, 12A, 12B, 13A, and 13B illustrate top views and cross-sectional views of intermediate stages in the formation of a transistor device comprising a p-type transistor 130P and an n-type transistor 130N (see FIGS. 13A-13B), in accordance with some embodiments of the present disclosure. These figure numbers are followed by a letter "A," or "B" wherein the letter "A" indicates that the respective view is a plan view (a top view), and the letter "B" indicates that the respective figure is a cross-sectional view. For example, FIG. 1B illustrates a cross-sectional view along the reference cross-section B-B' indicated in FIG. 1A. Unless otherwise described, a figure having a cross-sectional view is obtained from a cross-section in the respective plan view that is similar to the reference cross-section B-B' shown in FIG. 1A.

Figure 1B:
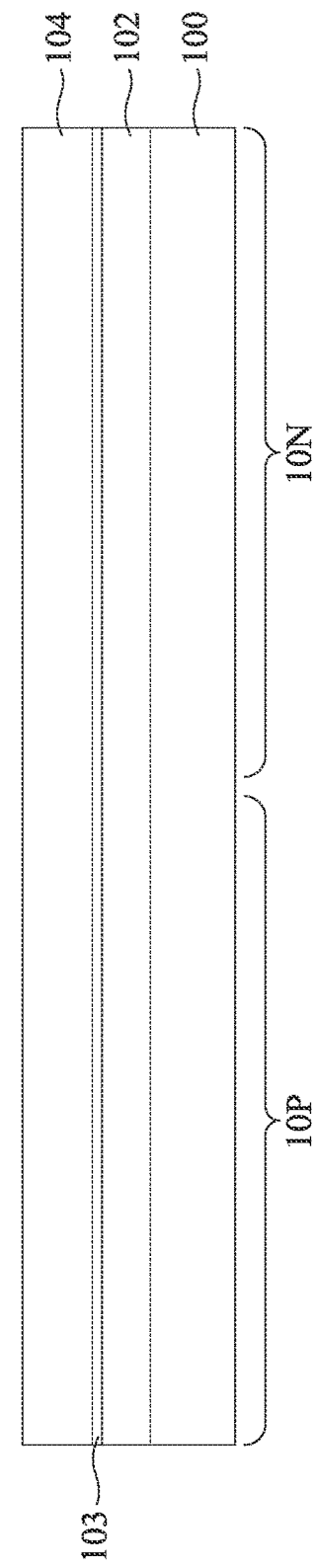

FIGS. 1A and 1B illustrate a top view and a cross-sectional view, respectively, of a substrate 100, in accordance with some embodiments. In some embodiments, the substrate 100 may be a semiconductor substrate, such as a bulk semiconductor substrate, a Semiconductor-On-Insulator (SOI) substrate, or the like. The substrate 100 may be doped (e.g., with a p-type or an n-type dopant) or undoped. The substrate 100 may be a part of a wafer, such as a silicon wafer. Generally, an SOI substrate is a layer of a semiconductor material formed on an insulator layer. The insulator layer may be, for example, a Buried Oxide (BOX) layer, a silicon oxide layer, or the like. The insulator layer is provided on a substrate, typically a silicon or glass substrate. Other substrates such as a multi-layered or gradient substrate may also be used. In some embodiments, the semiconductor material of substrate 100 may include silicon; germanium; a compound semiconductor including carbon-doped silicon, gallium arsenic, gallium phosphide, indium phosphide, indium arsenide, and/or indium antimonide; an alloy semiconductor including silicon germanium, silicon carbide, GaAsP, AlInAs, AlGaAs, GaInAs, GaInP, and/or GaInAsP; or combinations thereof. The substrate 100 may also be formed of other materials such as sapphire, indium tin oxide (ITO), or the like.

An isolation layer 102 is formed over the substrate 100, in accordance with some embodiments. The isolation layer 102 may or may not be in physical contact with the substrate 100. In some embodiments, other layers and/or device may be between the isolation layer 102 and the substrate 100. The other layers or devices may include dielectric layers such as inter-layer dielectrics (ILDs), inter-metal dielectrics (IMDs), low-k dielectric layers, the like, or combinations thereof. The other layers of devices may include metal features such as conductive routing, metal lines, vias, redistribution layers, metallization patterns, the like, or combinations thereof. There may be, or may not be, integrated circuit devices such as passive devices (capacitors, resistors, inductors, or the like) and/or active devices (transistors, diodes, or the like) formed between the isolation layer 102 and the substrate 100.

In accordance with some embodiments of the present disclosure, the isolation layer 102 is formed of or comprises a nitride such as silicon nitride, an oxide such as silicon oxide, another dielectric material such as silicon carbide, silicon oxycarbide, silicon oxynitride, silicon oxycarbonitride, hexagonal boron nitride (hBN), or the like, or a high-k dielectric material such as aluminum oxide, hafnium oxide, zirconium oxide, lanthanum oxide, or the like. The isolation layer 102 may be a crystalline layer (single crystalline or polycrystalline) or an amorphous layer. In some embodiments, the isolation layer 102 is formed of or comprises phospho-silicate glass (PSG), boro-silicate glass (BSG), boron-doped phospho-silicate glass (BPSG), fluorine-doped silicate glass (FSG), the like, or a combination thereof. The isolation layer 102 may have a single-layer structure or a composite structure including a plurality of layers. For example, the isolation layer 102 may include a bi-layer structure, a tri-layer structure, or the like. The bi-layer structure may include two layers formed of different materials, for example, a silicon oxide layer and a silicon nitride layer over the silicon oxide layer. The ILD may be formed using spin coating, Flowable Chemical Vapor Deposition (FCVD), or the like. In accordance with alternative embodiments of the present disclosure, the ILD is formed using a deposition method such as Plasma Enhanced Chemical Vapor Deposition (PECVD), Low Pressure Chemical Vapor Deposition (LPCVD), or the like.

The formation process of the isolation layer 102 may include one or a plurality of deposition process(es) including, for example, an Atomic Layer Deposition (ALD) process, a Chemical Vapor Deposition (CVD) process, a Plasma Enhanced Chemical Vapor Deposition (PECVD) process, a Plasma Enhanced Atomic Layer Deposition (PEALD) process, a Flowable Chemical Vapor Deposition (FCVD) process, a Low Pressure Chemical Vapor Deposition (LPCVD) process, spin-coating, or the like. In accordance with some embodiments of the present disclosure, the isolation layer 102 may also be formed through thermal oxidation, chemical oxidation, or the like, for example, when the isolation layer 102 comprises silicon oxide and when substrate 100 is formed of or comprises silicon.

As shown in FIG. 1B, an etch stop layer 103 may be formed over the isolation layer 102, in accordance with some embodiments. The etch stop layer 103 may be formed of or comprise a material having a different etching selectivity than the overlying isolation layer 104 (described below). The etch stop layer 103 may be, for example, an oxide such as silicon oxide, a nitride such as silicon nitride, silicon oxynitride, silicon oxycarbide, silicon oxycarbonitride, a metal oxide or high-k dielectric material such as aluminum oxide, hafnium oxide, zirconium oxide, lanthanum oxide, or the like. Other materials are possible. The etch stop layer 103 may be formed using a suitable technique, such as those described above for the isolation layer 102. In other embodiments, the etch stop layer 103 is not formed.

In some embodiments, an isolation layer 104 is formed over the etch stop layer 103 (if present). The isolation layer 104 may comprise one or more layers of materials having an etching selectivity that is different from the underlying etch stop layer 103. In some embodiments, the isolation layer 104 comprises one or more materials described above for the isolation layer 102, though other materials are possible. The isolation layer 104 may be formed using a suitable technique, such as those described above for the isolation layer 102.

As also shown in FIG. 1B, the substrate 100 may have a p-type region 10P and an n-type region 10N, in accordance with some embodiments. The p-type region 10P can be for forming p-type devices, such as PMOS transistors, e.g., p-type FinFETs or p-type planar transistors. The n-type region 10N can be for forming n-type devices, such as NMOS transistors, e.g., n-type FinFETs or n-type planar transistors. FIGS. 1A and 1B illustrate an embodiment in which a p-type region 10P is contiguous with an n-type region 10N. In other embodiments, a p-type region 10P may be physically separated from an n-type region 10N, and any number of device features (e.g., other active devices, doped regions, isolation structures, etc.) may be disposed between the p-type region 10P and the n-type region 10N.

In FIGS. 2A and 2B, a semiconductor layer 106, a gate dielectric layer 108, and a conductive layer 110 are formed, in accordance with some embodiments. The semiconductor layer 106 may be used as a channel layer or active layer in the subsequently formed transistors. In accordance with some embodiments of the present disclosure, the semiconductor layer 106 is formed of a two-dimensional (2D) material, which may include one monolayer or a plurality of monolayers. As such, a semiconductor layer formed of one or more monolayers of a 2D material may be referred to herein as a "2D semiconductor layer." In some embodiments, the semiconductor layer 106 may include carbon nanotube networks, aligned carbon nanotubes. The carbon nanotube networks and aligned carbon nanotubes may be formed using immersion, drop-casting, or the like methods.

In some embodiments, the semiconductor layer 106 may comprise one or more 2D materials such as Transition Metal Dichalcogenides (TMDs) or the like. The TMD material may be the compound of a transition metal and a group-VIA element (e.g., a chalcogen). The transition metal may include W, Mo, Ti, V, Co, Ni, Zr, Tc, Rh, Pd, Hf, Ta, Re, Ir, Pt, or the like. The group-VIA element may be sulfur, selenium, tellurium, or the like. For example, the semiconductor layer 106 may be formed of or comprise $MoS_2$, $MoSe_2$, $WS_2$, $WSe_2$, $ReS_2$, or the like. The semiconductor layer 106 may comprise other materials such as $SnS_2$, InSe, phosphorene, tellurene, graphene, or the like. The formation of the TMD material may include CVD, for example, with $MoO_3$ powder and sulfur or selenium powder being used as precursors, and $N_2$ being used as a carrier gas. In accordance with alternative embodiments of the present disclosure, PECVD or another applicable method may be used to form the TMD material. In accordance with some embodiments of the present disclosure, the semiconductor layer 106 has a thickness in the range of about 0.3 nm to about 10 nm, though other thicknesses are possible. The thickness of the semiconductor layer 106 may depend on the number of monolayers within the semiconductor layer 106.

However, the processes as described above are intended to be illustrative only and are not intended to be limiting upon the embodiments. Rather, any suitable process of forming or placing the semiconductor layer 106 onto the isolation layer 104 may be utilized. For example, a CVD process using precursors such as $MoO_3$ and $H_2S$, or precursors such as Mo and $H_2S$, may also be utilized. In some embodiments, a physical vapor deposition PVD process which utilizes a $MoS_2$ target may be utilized. Additionally, any other suitable processes, such as dissociation of spin-on coated $(NH_4)_2MoS_4$, or growing the semiconductor layer 106 on a substrate (e.g., copper, nickel, sapphire, or the like) and then transferring the semiconductor layer 106 to the isolation layer 104, may be used. In some embodiments, the TMD material for the semiconductor layer 106 may be formed in bulk separately from the substrate 100 and then a layer of the bulk semiconductor layer material is removed and placed onto the isolation layer 104. Any suitable method of forming or placing the semiconductor layer 106 may be used, and all such methods are fully intended to be included within the scope of the embodiments.

A gate dielectric layer 108 may then be deposited over the semiconductor layer 106. In accordance with some embodiments, the gate dielectric layer 108 comprises a high-k dielectric material such as $HfO_2$, $Al_2O_3$, $ZrO_2$, $Y_2O_3$, $ErO_2$, hBN, or the like, though other materials may be used such as other metal oxides, silicon oxides, silicon nitrides, or the like. In some embodiments, the gate dielectric layer 108 comprises multiple materials, such as a combination including one or more materials listed above. The deposition method may include ALD, CVD, PECVD, or the like. In accordance with some embodiments, the thickness of gate dielectric layer 108 is in the range of about 0.5 nm to about 50 nm. Other thicknesses are possible.

A conductive layer 110 may then be formed over the gate dielectric layer 108. The conductive layer 110 is subsequently patterned to form gate electrodes 110P/110N (see FIGS. 4A-4B). The conductive layer 110 may include a metal-containing material such as titanium nitride, titanium oxide, tantalum nitride, tantalum carbide, cobalt, ruthenium, aluminum, tungsten, the like, combinations thereof, or multi-layers thereof. Other materials are possible. For example, although a single conductive layer 110 is illustrated in FIGS. 2A-2B, the conductive layer 110 may comprise any number of seed layers, any number of liner layers, or any number of work function tuning layers. The conductive layer 110 may be deposited by PVD, CVD, sputter deposition, plating, or other techniques known and used in the art for depositing conductive materials. After the forming of the conductive layer 110, a planarization process, such as a chemical mechanical polish (CMP) or the like, may be performed to planarize a top surface of the conductive layer 110. In accordance with some embodiments, the thickness of the conductive layer 110 is in the range of about 10 nm to about 30 nm. Other thicknesses are possible.

FIGS. 3A through 4B illustrate the patterning of the conductive layer 110, the gate dielectric layer 108, and the semiconductor layer 106, in accordance with some embodiments. In FIGS. 3A and 3B, a patterned mask 112 is formed over the conductive layer 110, in accordance with some embodiments. The patterned mask 112 may be formed, for example, by first depositing a mask material over the conductive layer 110. For example, the mask material may be a material such as an oxide, a nitride, or the like, a photoresist layer or the like, or a multilayer photoresist structure or the like. The mask material may be deposited using a suitable technique, such as CVD, spin-on, or the like. The mask material may then be patterned using acceptable photolithography and etching techniques to form the patterned mask 112.

Figure 4A:
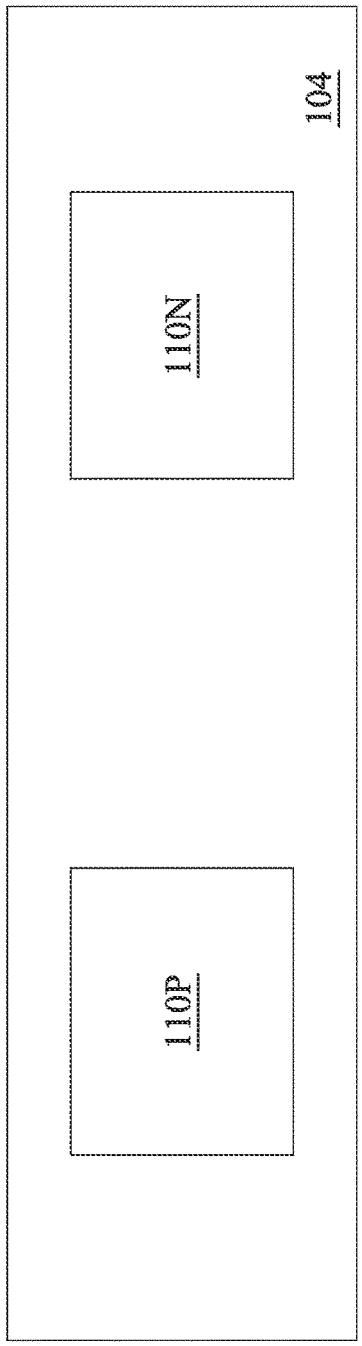
Figure 4B:
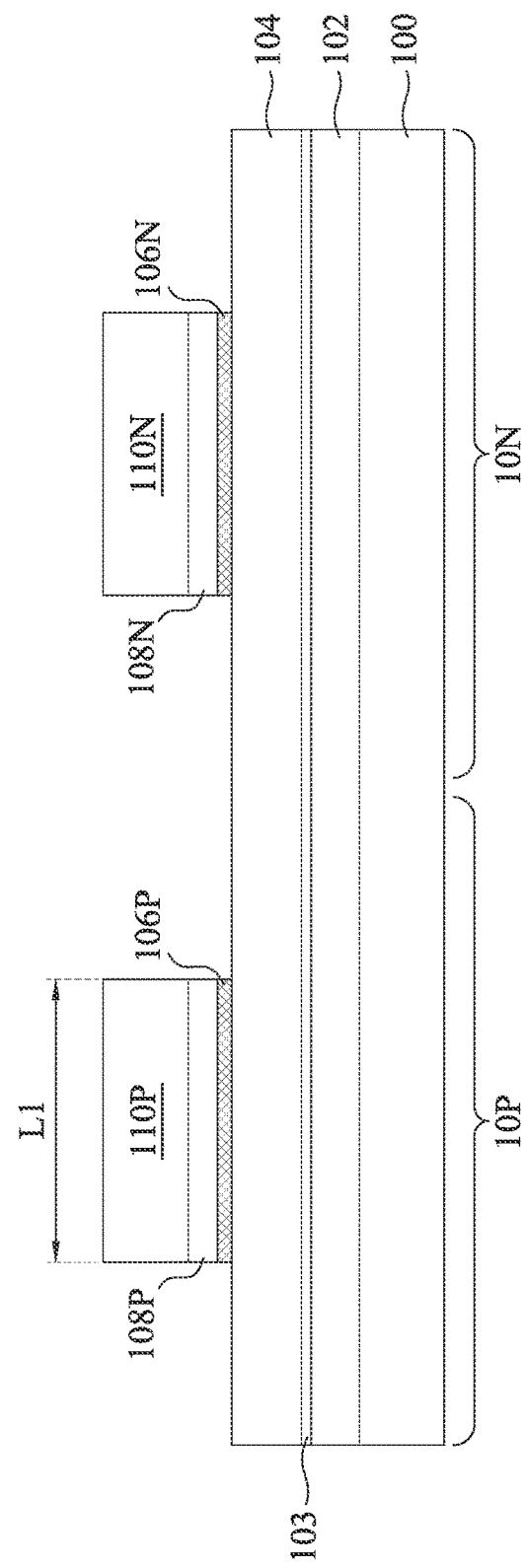

In FIGS. 4A and 4B, the pattern of the patterned mask 112 is transferred to the conductive layer 110, the gate dielectric layer 108, and the semiconductor layer 106, in accordance with some embodiments. For example, an etching process may be performed using the patterned mask 112 as an etching mask. The etching process may include one or more suitable wet etching processes and/or dry etching processes, which may be anisotropic. In some embodiments, the etching process may have a selectivity such that the isolation layer 104 acts as an etch stop layer. After the etching process, the patterned mask 112 may remain on the conductive layer 110, in some embodiments.

As shown in FIGS. 4A-4B, the etching process forms a semiconductor layer 106P in the p-type region 10P and a semiconductor layer 106N in the n-type region 10N. The semiconductor layer 106P forms, for example, a channel region of a p-type transistor in the p-type region 10P, and the semiconductor layer 106N forms, for example, a channel region of an n-type transistor in the n-type region 10N. In other embodiments, multiple semiconductor layers 106P or multiple semiconductor layers 106N may be formed. In other embodiments, a semiconductor layer 106P and a semiconductor layer 106N may be contiguously formed from a single continuous region of semiconductor layer 106.

The patterned gate dielectric layer 108 forms a gate dielectric layer 108P over the semiconductor layer 106P in the p-type region 10P and a gate dielectric layer 108N over the semiconductor layer 106N in the n-type region 10N. The patterned conductive layer 110 forms a gate electrode 110P over the gate dielectric layer 108P in the p-type region 10P and a gate electrode 110N over the gate dielectric layer 108N in the n-type region 10N. The gate electrode 110P and the gate dielectric layer 108P may be collectively referred to as a "p-type gate stack" or "p-type gate structure." Similarly, the gate electrode 110N and the gate dielectric layer 108N may be collectively referred to as a "n-type gate stack" or "n-type gate structure." In some embodiments, a gate stack may have a length L1 that is in the range of about 5 nm to about 1000 nm, though other lengths are possible.

Figure 5A:
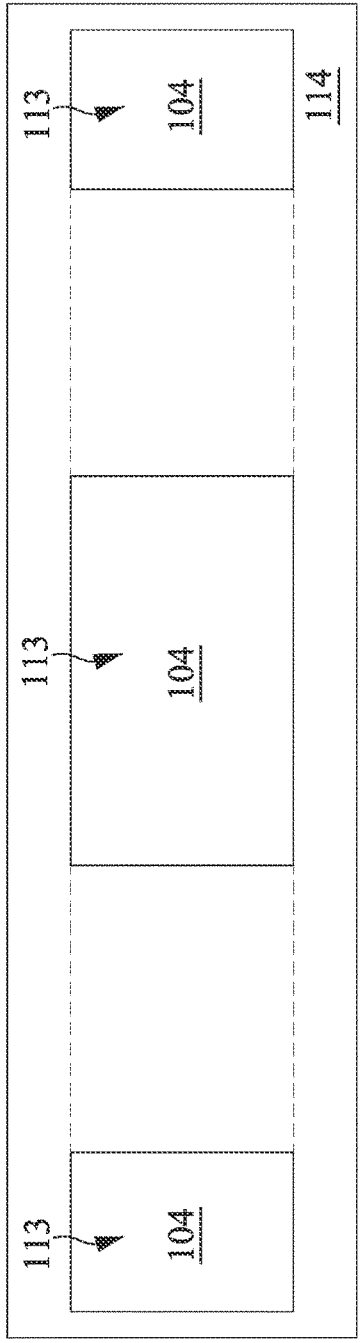
Figure 5B:
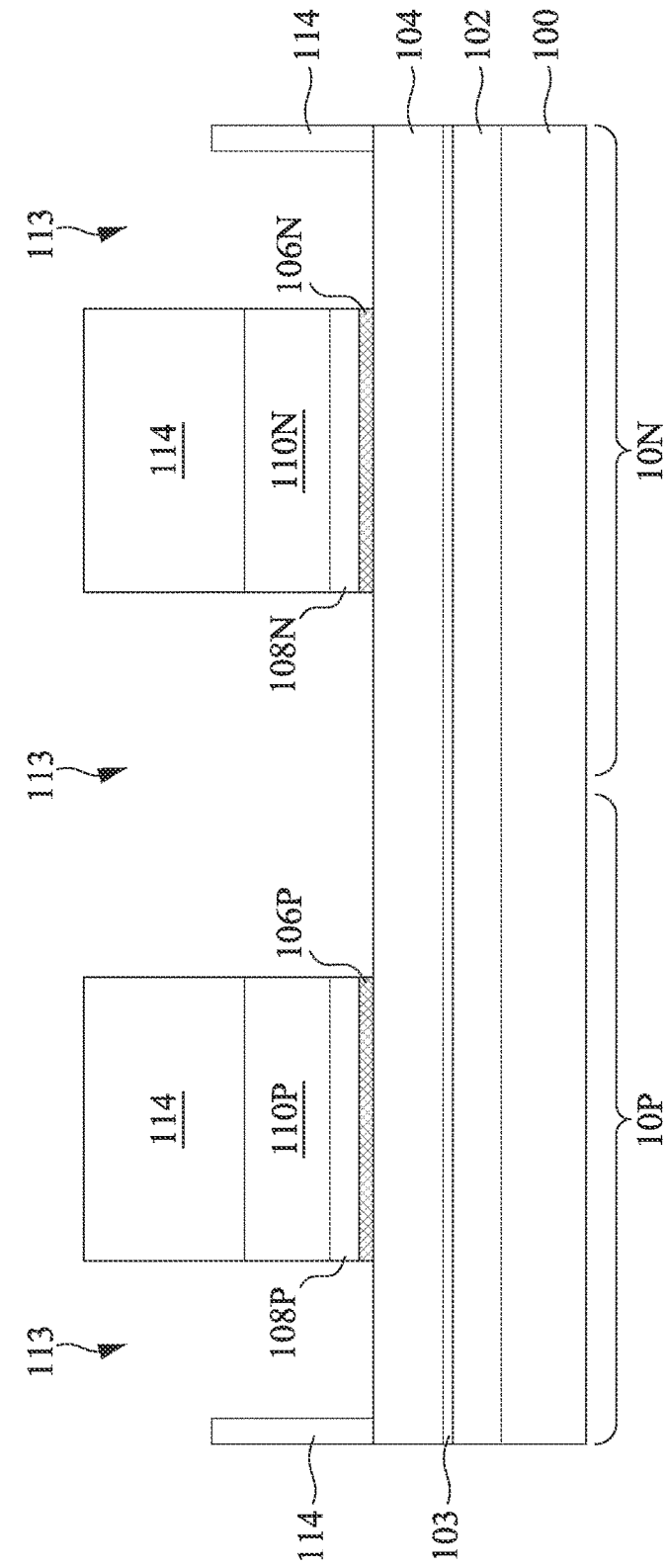

FIGS. 5A through 8B illustrate the formation of source/drain metal 116, in accordance with some embodiments. The source/drain metal 116 and the subsequently formed contact layer 118 (see FIGS. 9A-9B) form source/drain regions 120P/120N (see FIGS. 11A-11B) that contact the semiconductor layer 106. In FIGS. 5A-5B, a patterned photoresist 114 is formed over the isolation layer 104 and around the gate stacks. For example, the photoresist 114 may be formed by spin coating or the like and may be patterned using suitable photolithographic techniques. The patterning forms openings 113 through the photoresist 114 that correspond to the source/drain metal 116 (see FIGS. 7A-8B). The openings 113 may expose the areas of the isolation layer 104 adjacent the gate stacks. As shown in FIGS. 5A-5B, the gate stacks may remain covered by the patterned mask 112.

Figure 6A:
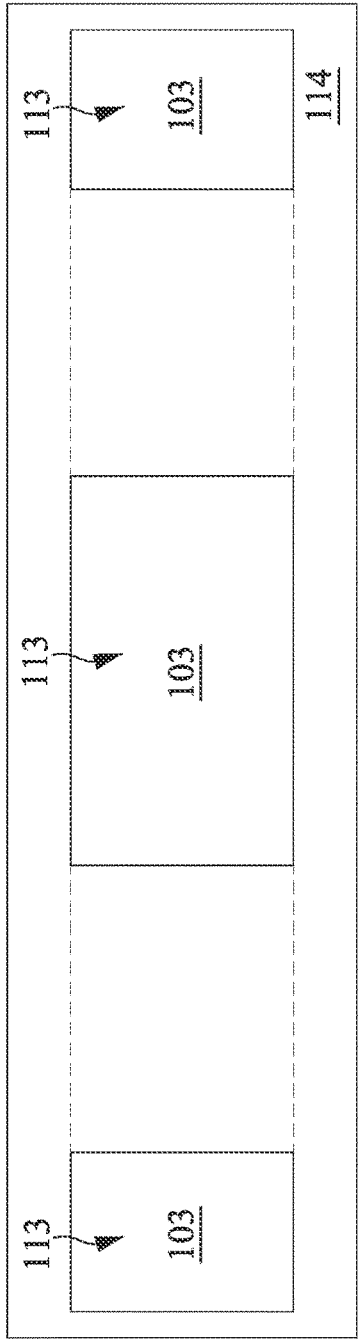
Figure 6B:
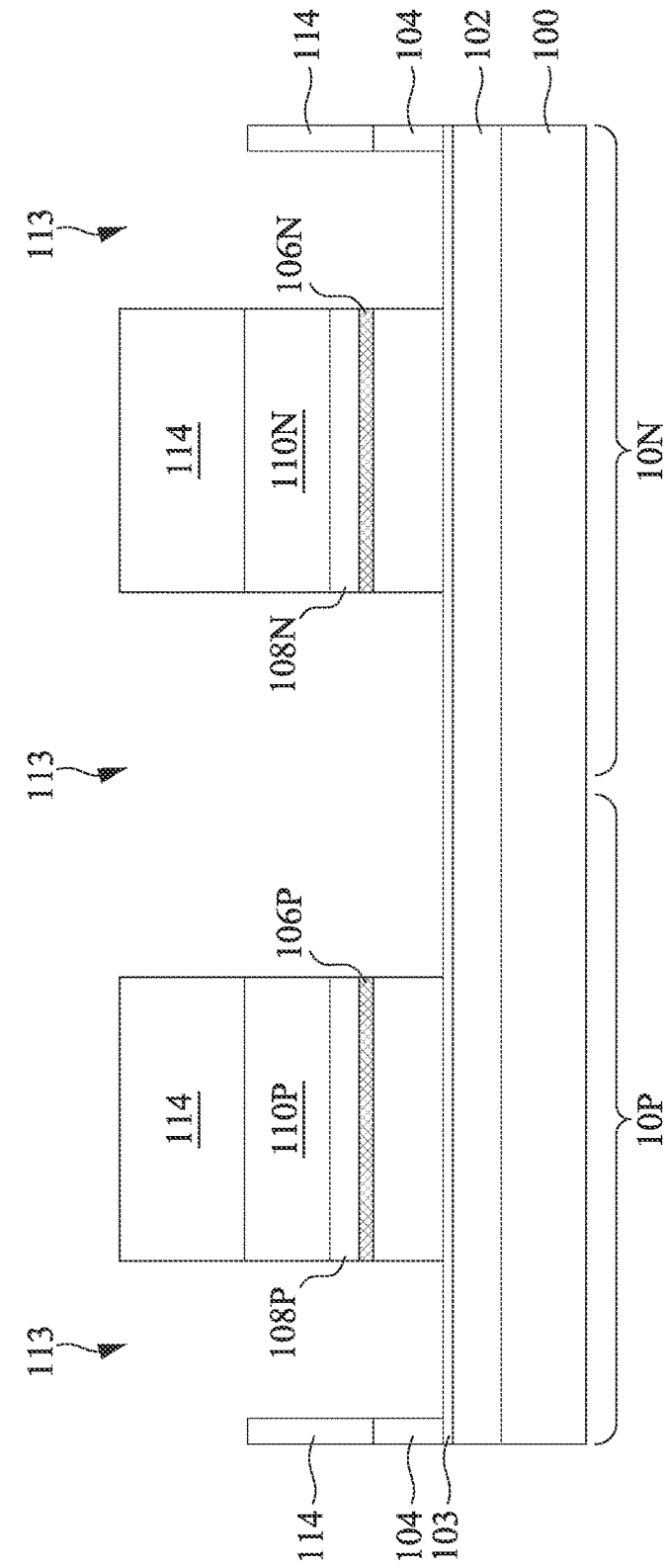

In FIGS. 6A and 6B, the openings 113 in the pattern of the photoresist 114 are extended through the isolation layer 104, in accordance with some embodiments. An etching process may be performed using the patterned photoresist 114 and the patterned mask 112 as a combined etching mask. For example, a wet etching process and/or a dry etching process may be performed to etch portions of the isolation layer 104 exposed by the openings 113. The etching process may be anisotropic. As shown in FIGS. 6A-6B, the etching process may stop on the etch stop layer 103. The etching process forms openings 113 in the isolation layer 104 that are adjacent the semiconductor layer 106. In some embodiments, an opening 113 in the isolation layer 104 may extend from one semiconductor layer 106 to another semiconductor layer 106, such as between two semiconductor layers 106P in the p-type region 10P, between two semiconductor layers 106N in the n-type region 10N, or between a semiconductor layer 106P and a semiconductor layer 106N, as shown in FIGS. 6A-6B.

In other embodiments, an etch stop layer 103 may not be present. In some cases, the etching process may remove upper portions of the patterned photoresist 114 and/or the patterned mask 112. In other embodiments, the etching process may not extend the openings fully through the isolation layer 104, or the etching process may also etch other layers below the isolation layer 104.

Figure 7A:
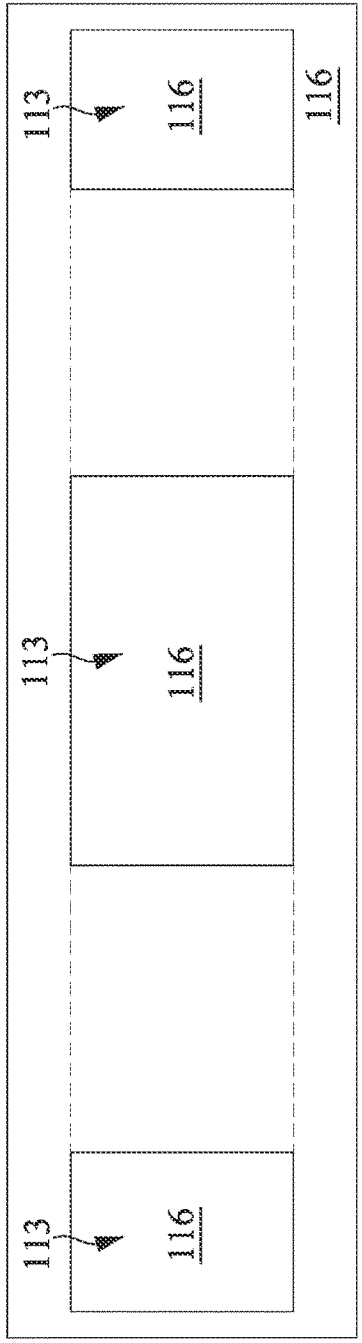
Figure 7B:
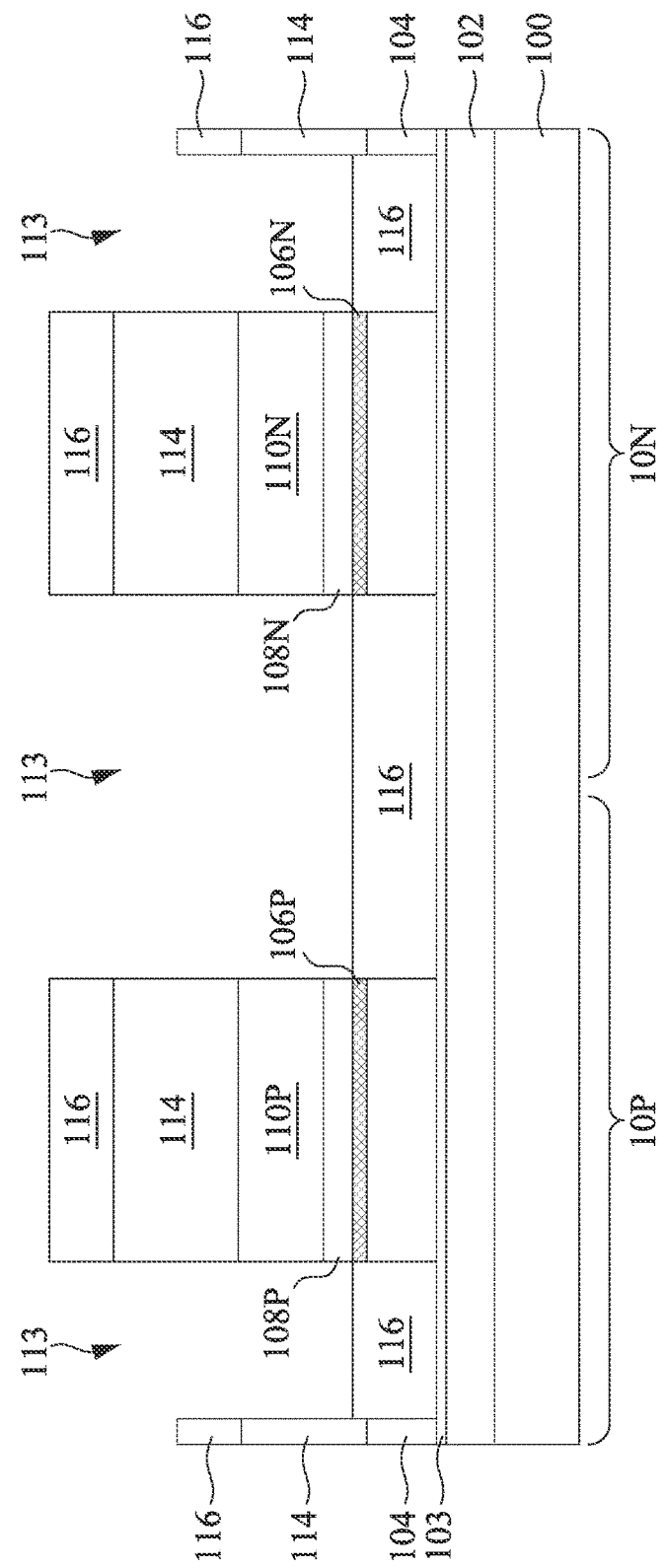

In FIGS. 7A and 7B, the source/drain metal 116 material is deposited, in accordance with some embodiments. The source/drain metal 116 may be deposited within the openings 113 in the isolation layer 104 and over some surfaces of the patterned photoresist 114 and/or the patterned mask 112, in some cases. The source/drain metal 116 may be formed by ALD, PVD, CVD, sputter deposition, plating, such as electroplating or electroless plating, or other techniques known and used in the art for depositing conductive material. In some embodiments, the conductive material may include a metal-containing material such as titanium nitride, titanium oxide, tantalum nitride, tantalum carbide, cobalt, ruthenium, aluminum, tungsten, nickel, titanium, tantalum, bismuth, tin, antimony, gold, platinum, palladium, niobium, copper, combinations thereof, or multi-layers thereof. For example, although a source/drain metal 116 is illustrated in FIGS. 7A-7B, the source/drain metal 116 may comprise more than one layer of conductive material.

As an example of formation of the source/drain metal 116, a seed layer (not shown) may be formed over the patterned photoresist 114, over the patterned mask 112, and in the openings 113. In some embodiments, the seed layer is a metal layer, which may be a single layer or a composite layer comprising a plurality of sub-layers formed of different materials. The seed layer may be formed using, for example, PVD or the like. A conductive material is formed on the seed layer. The conductive material may be formed by plating, such as electroplating or electroless plating, or the like.

In other embodiments, the material(s) of the source/drain metal 116 in the p-type region 10P is different from the material(s) of the source/drain metal 116 in the n-type region 10N. The materials of the source/drain metal 116 in each region 10P/10N may be chosen, for example, to have appropriate work functions for each region 10P/10N. In some embodiments, different deposition processes may be used in the p-type region 10P and the n-type region 10N, with the n-type region 10N covered by a mask (e.g., a photoresist) during deposition of one or more materials in the p-type region 10P, and with the p-type region 10P covered by a mask during deposition of one or more materials in the n-type region 10N. In this manner, in some embodiments, more or different photolithographic and patterning steps may be utilized. Other techniques or process steps are possible.

Figure 8A:
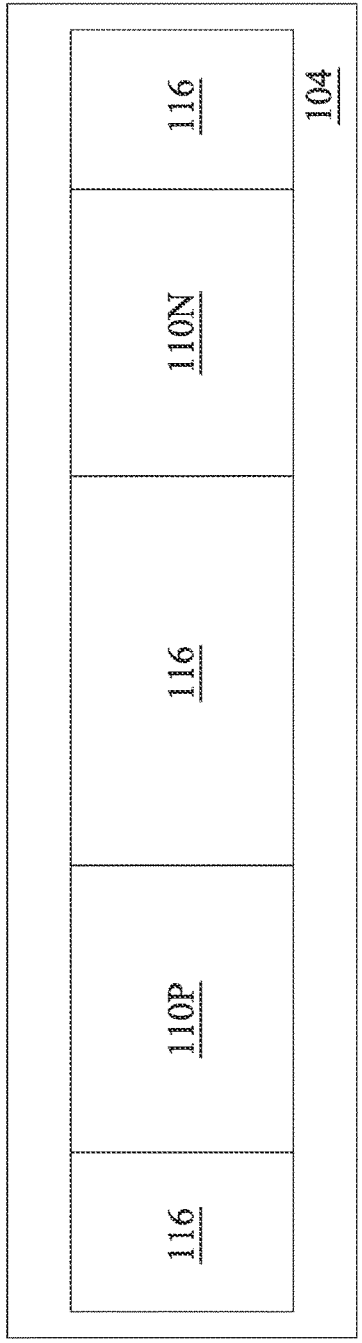
Figure 8B:
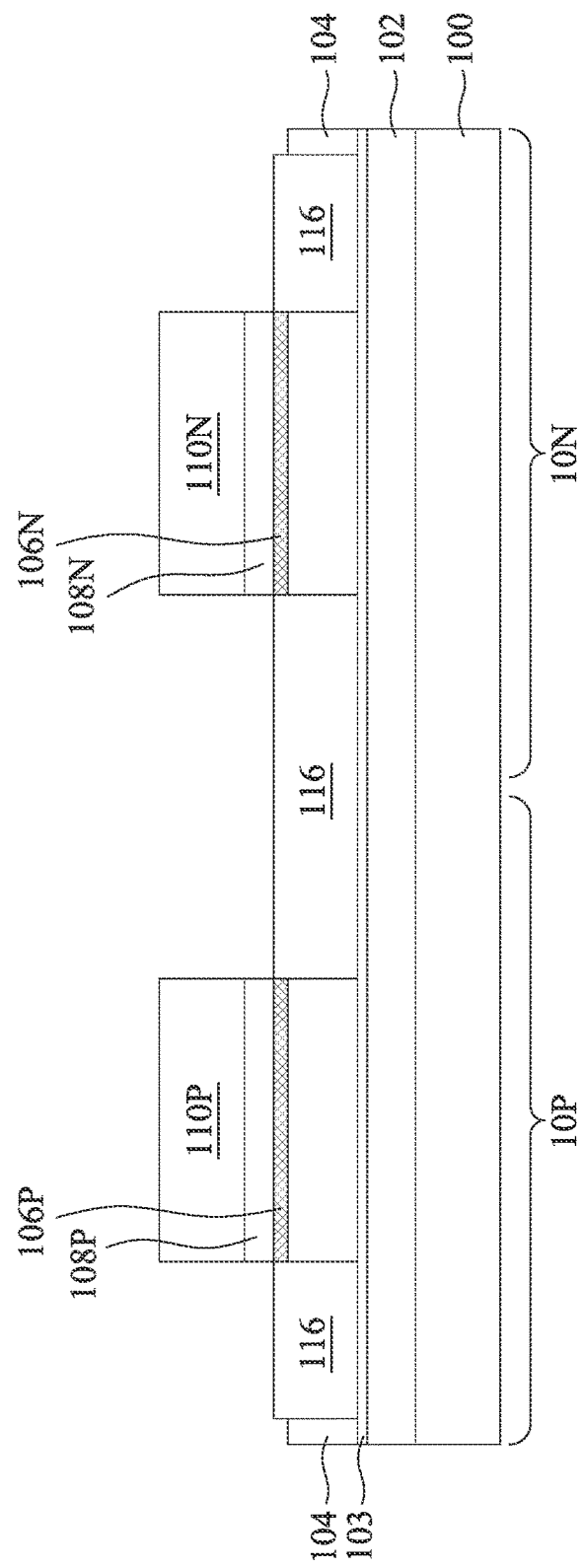

In FIGS. 8A and 8B, the patterned photoresist 114 and the patterned mask 112 are removed, in accordance with some embodiments. The patterned photoresist 114 and the patterned mask 112 may be removed using acceptable ashing or etching processes, such as using an oxygen plasma, one or more wet etching processes, the like, or a combination thereof. Removing the patterned photoresist 114 and the patterned mask 112 also removes portions of the seed layer and source/drain metal 116 deposited thereon. Once the patterned photoresist 114 and the patterned mask 112 are removed, any remaining portions of the seed layer may be removed using a suitable etching process, in some embodiments. After removing the patterned photoresist 114 and the patterned mask 112, portions of source/drain metal 116 remain within the openings 113 in the isolation layer 104. In this manner, the formation of the source/drain metal 116 may be considered a "self-aligned" deposition, in some cases. The remaining portions of the seed layer and the source/drain metal 116 may collectively be referred to herein as "the source/drain metal 116."

In some embodiments, a top surface of the source/drain metal 116 is above a bottom surface of the semiconductor layer 106 and below a top surface of the semiconductor layer 106, as shown in FIG. 8B. In other words, a top surface of the source/drain metal 116 may be adjacent a sidewall surface of the semiconductor layer 106. In other embodiments, a top surface of the source/drain metal 116 is below a bottom surface of the semiconductor layer 106, approximately level with a bottom surface of the semiconductor layer 106, above a top surface of the semiconductor layer 106, or approximately level with a top surface of the semiconductor layer 106. In this manner, a top surface of the source/drain metal 116 may be below, approximately level with, or above a top surface of the isolation layer 104. In some embodiments, the thickness (e.g., the vertical position of the top surface) of the source/drain metal 116 may be controlled by controlling the deposition parameters during deposition of the source/drain metal 116. For example, the thickness of the source/drain metal 116 may be controlled to vertically align the subsequently formed contact layer 118 (see FIGS. 9A-9B) with the semiconductor layer 106. In some embodiments, the source/drain metal 116 may have a thickness in the range of about 5 nm to about 100 nm, though other thicknesses are possible.

Figure 9A:
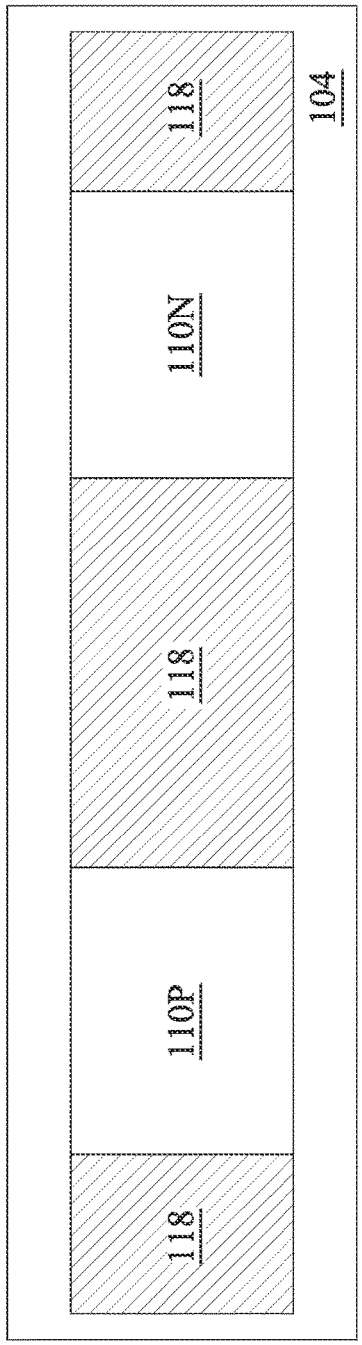
Figure 9B:
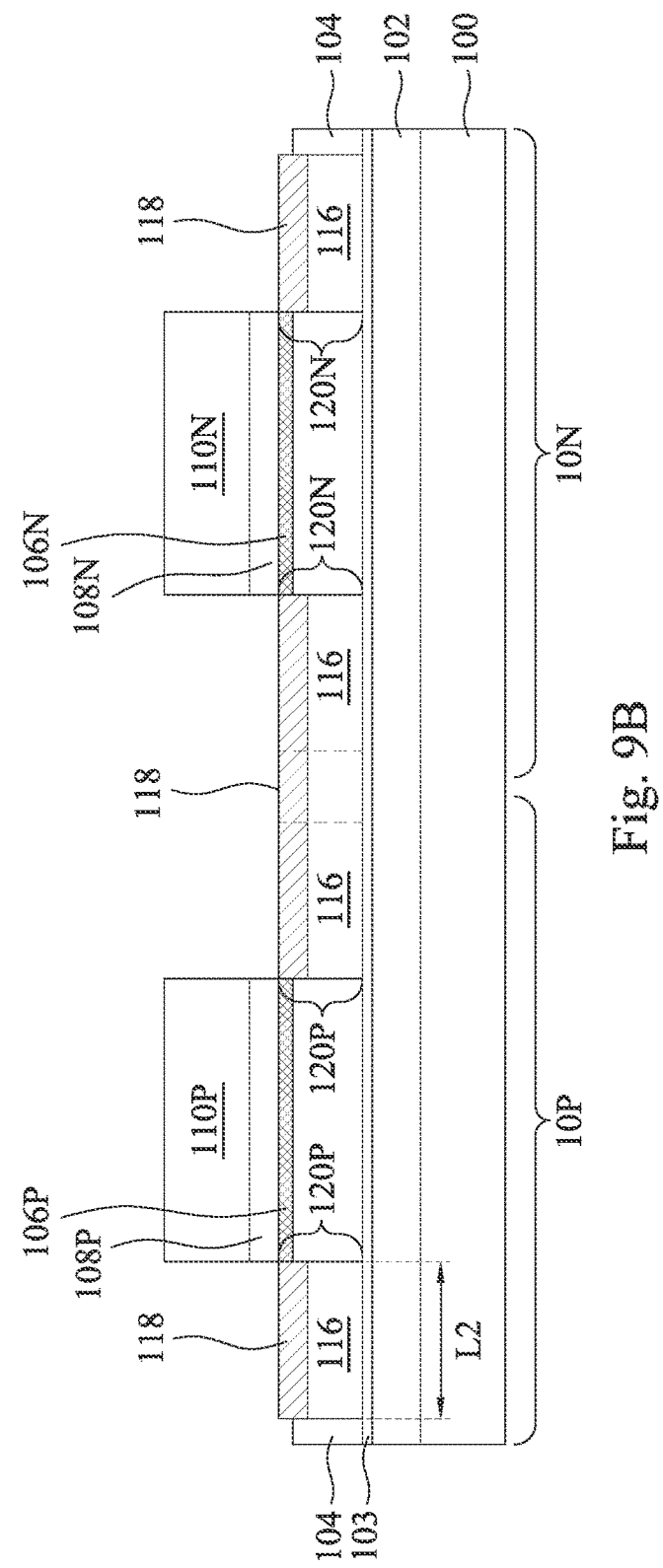

In FIGS. 9A and 9B, a contact layer 118 is formed on the source/drain metal 116 to form source/drain regions 120P/

120N, in accordance with some embodiments. The contact layer 118 physically and electrically contacts the sidewall of the 2D semiconductor layer 106. In this manner, the contact layer 118 is electrically coupled to side surfaces or edge surfaces of monolayer(s) of the 2D semiconductor layer 106. As shown in FIG. 9B, each region of source/drain metal 116 and its overlying contact layer 118 in the p-type region 10P forms a source/drain region 120P contacting a sidewall of the semiconductor layer 106P, and each region of source/drain metal 116 and its overlying contact layer 118 in the n-type region 10N forms a source/drain region 120N contacting a sidewall of the semiconductor layer 106N. The source/drain regions 120P/120N are formed partially within the isolation layer 104 and thus may be considered "embedded contacts" to the semiconductor layer 106 or "self-aligned contacts" to the semiconductor layer 106 in some cases. In other embodiments, the source/drain metal 116 formed in the p-type region 10P may be a different material than the source/drain metal 116 formed in the n-type region 10N, and/or the contact layer 118 formed in the p-type region 10P may be a different material than the contact layer 118 formed in the n-type region 10N.

In some cases, forming a contact layer 118 that contacts a 2D semiconductor layer 106 on a sidewall can allow for improved electrical connection between the source/drain region 120P/120N and the semiconductor layer 106. For example, in some cases, an electrical contact between a metal and a planar surface of a 2D monolayer can have a large Schottky resistance due to Fermi-level pinning at the planar interface. The Fermi-level pinning may be approximately independent of the particular metal used. Accordingly, this Fermi-level pinning can cause a large contact resistance between a metal contact and a planar surface of a 2D semiconductor layer. However, in some cases, the interface between a metal and an edge surface of a 2D monolayer can have little or no Fermi-level pinning. Thus, an electrical contact between a metal and an edge surface of a 2D monolayer can have a relatively smaller Schottky resistance. In this manner, electrically contacting the edge surfaces (e.g., the sidewall) of a 2D semiconductor layer 106 rather than electrically contacting the planar surfaces (e.g., the top surface) of the 2D semiconductor layer 106 can allow for reduced contact resistance.

Additionally, by forming a source/drain region 120P/120N that contacts a sidewall of the 2D semiconductor layer 106 as described herein rather than a top surface of the 2D semiconductor layer 106, damage to the upper monolayer(s) of the 2D semiconductor layer 106 during deposition of the materials of the source/drain region 120P/120N can be avoided. Further, forming a source/drain region 120P/120N that contacts a sidewall of the 2D semiconductor layer 106 as described herein avoids processes that may leave photoresist residue or other types of process residue on a top surface of the semiconductor layer 106.

Still referring to FIGS. 9A and 9B, the contact layer 118 may comprise a conductive 2D material that includes one or more monolayers, in some embodiments. In this manner, edge surfaces of the 2D monolayers of the contact layer 118 make physical and electrical contact to edge surfaces of the 2D monolayers of the semiconductor layer 106. By using edge surfaces of the 2D contact layer 118 to electrically contact the 2D semiconductor layer 106, effects from Fermi-level pinning may be further reduced and the contact resistance between the source/drain region 120P/120N and the semiconductor layer 106 may be correspondingly reduced.

The contact layer 118 may comprise one or more conductive 2D materials including graphene, Transition Metal Dichalcogenides (TMDs), or the like. The conductive 2D materials may be doped or undoped. In some embodiments, the monolayers of the contact layer 118 may be doped using a low-k doping layer 122P/122N, described in greater detail below for FIGS. 10A-10B. The monolayers of the contact layer 118 may be formed on the source/drain metal 116. In some embodiments, the monolayers of the contact layer 118 may include the same metal(s) as the source/drain metal 116. In some embodiments, upper portions of the source/drain metal 116 are incorporated into the monolayers of the contact layer 118.

In some embodiments, the contact layer 118 comprises a conductive TMD material. For example, the contact layer 118 may comprise a TMD material such as $NbSe_2$, $NbS_2$, $PtSe_2$, $PtS_2$, $VSe_2$, $VS_2$, or the like. Other materials are possible. In some embodiments, at least an upper portion of the source/drain metal 116 comprises the same transition metal as the overlying contact layer 118. For example, upper portions of the source/drain metal 116 may comprise Nb, Pt, V, or the like. In some embodiments, at least a portion of the TMD material of the contact layer 118 is formed by reacting a group-VIA element (e.g., sulfur, selenium, tellurium, or the like) with upper portions of the source/drain metal 116. For example, in some embodiments the TMD material may be formed by exposing top surfaces of the source/drain metal 116 to a sulfur powder or selenium powder to sulfurize or selenize upper portions of the source/drain metal 116. In some embodiments, the group-VIA element is reacted with the source/drain metal 116 at a process temperature in the range of about 250° C. to about 700° C., though other process temperatures are possible. In other embodiments, the TMD material of the contact layer 118 may be formed on the source/drain metal 116 without incorporating the source/drain metal 116. The contact layer 118 may comprise a conductive TMD material that is undoped (e.g. intrinsic), in some embodiments. In other embodiments, another suitable technique or a combination of techniques may be used to form a conductive TMD material, such as CVD, PECVD, ALD, MBE, or the like. In some embodiments, an anneal process may be performed after forming the contact layer 118.

In some embodiments, the contact layer 118 may be formed of a doped TMD material. In some cases, doping the TMD material can enhance the conductivity of the contact layer 118. The TMD material may be similar to the conductive TMD materials described above, or may be a different TMD material such as $MoS_2$, $MoSe_2$, $WS_2$, $WSe_2$, $ReS_2$, or the like. In some embodiments, a dopant species may be introduced during formation of the contact layer 118 (e.g., using in-situ doping). The dopant species may act as a substitutional dopant, in some cases. For example, a vanadium precursor (e.g., $V_2O_5$ or the like) may be used during the formation of $MoS_2$ to form a contact layer 118 comprising V-doped $MoS_2$. This is an example, and other TMD materials, dopants, or precursors are possible. For example, in some embodiments, one or more other dopant species may be used, such as Fe, Nb, Re, Sn, Cl, N, O, the like, or combinations thereof. In other embodiments, another suitable technique or a combination of techniques may be used to form a doped TMD material, such as CVD, PECVD, ALD, MBE, or the like. In some embodiments, the doped TMD material may be formed using a process temperature in the range of about 250° C. to about 700° C., though other process temperatures are possible. In some embodiments, an anneal process may be performed after forming the doped contact layer 118.

In some embodiments, the doping of the contact layer 118 may be achieved using a low-k doping layer 122P/122N that covers the contact layer 118 and provides a doping-like effect to the TMD material of the contact layer 118. FIGS. 10A through 13B, described in greater detail below, illustrate an embodiment in which low-k doping layers 122P/122N are used to provide effective doping for contact layers 118. The low-k doping layer 122P/122N may be used in addition to or instead of other techniques for doping the contact layer 118. In other embodiments, a low-k doping layer 122P/122N is not formed, and FIGS. 20A-20B, described in greater detail below, illustrate embodiments without a low-k doping layer 122P/122N. In other embodiments, the contact layer 118 is not a 2D material but is a layer of conductive material comprising, for example, a metal or metal alloy. FIGS. 21A-21B, described in greater detail below, illustrate embodiments in which the contact layer 118 is a layer of conductive material.

In some embodiments, a top surface of the contact layer 118 is approximately level with a top surface of the semiconductor layer 106, as shown in FIG. 9B. In other embodiments, a top surface of the contact layer 118 is below a top surface of the semiconductor layer 106. In other embodiments, a top surface of the contact layer 118 is above a top surface of the semiconductor layer 106. Example embodiments in which a top surface of the contact layer 118 is above a top surface of the semiconductor layer 106 is described below for FIGS. 18A-18B. A top surface of the contact layer 118 may be above, about level with, or below a top surface of the isolation layer 104. A bottom surface of the contact layer 118 may be above, about level with, or below a bottom surface of the semiconductor layer 106. In this manner, the contact area between a contact layer 118 and a semiconductor layer 106 may have a height about the same as a thickness of the semiconductor layer 106 or may have a height less than a thickness of the semiconductor layer 106. In other words, the contact layer 118 may partially or fully cover the sidewall of the semiconductor layer 106.

In some embodiments, the contact layer 118 may have a thickness in the range of about 0.4 nm to about 50 nm, though other thicknesses are possible. A thickness of the contact layer 118 may be greater than, about the same as, or less than a thickness of the semiconductor layer 106. In cases, increasing the contact area between a contact layer 118 and a semiconductor layer 106 by increasing the thickness of the contact layer 118 may allow for reduced contact resistance between the source/drain region 120P/120N and the semiconductor layer 106. The thickness of the contact layer 118 may be controlled, for example, by controlling the number of monolayers formed within the contact layer 118. In some embodiments, a source/drain region 120P/120N may have a length L2 that is in the range of about 3 nm to about 500 nm, though other lengths are possible.

Figure 10A:
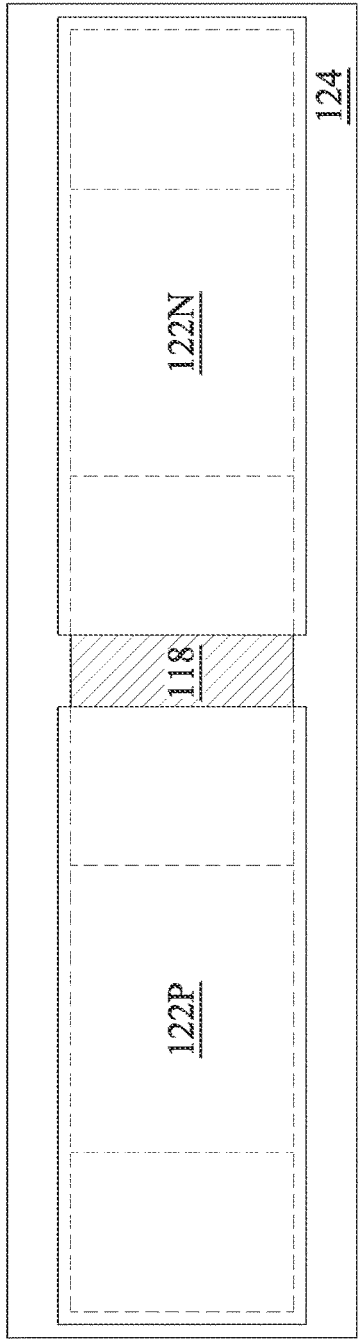
Figure 10B:
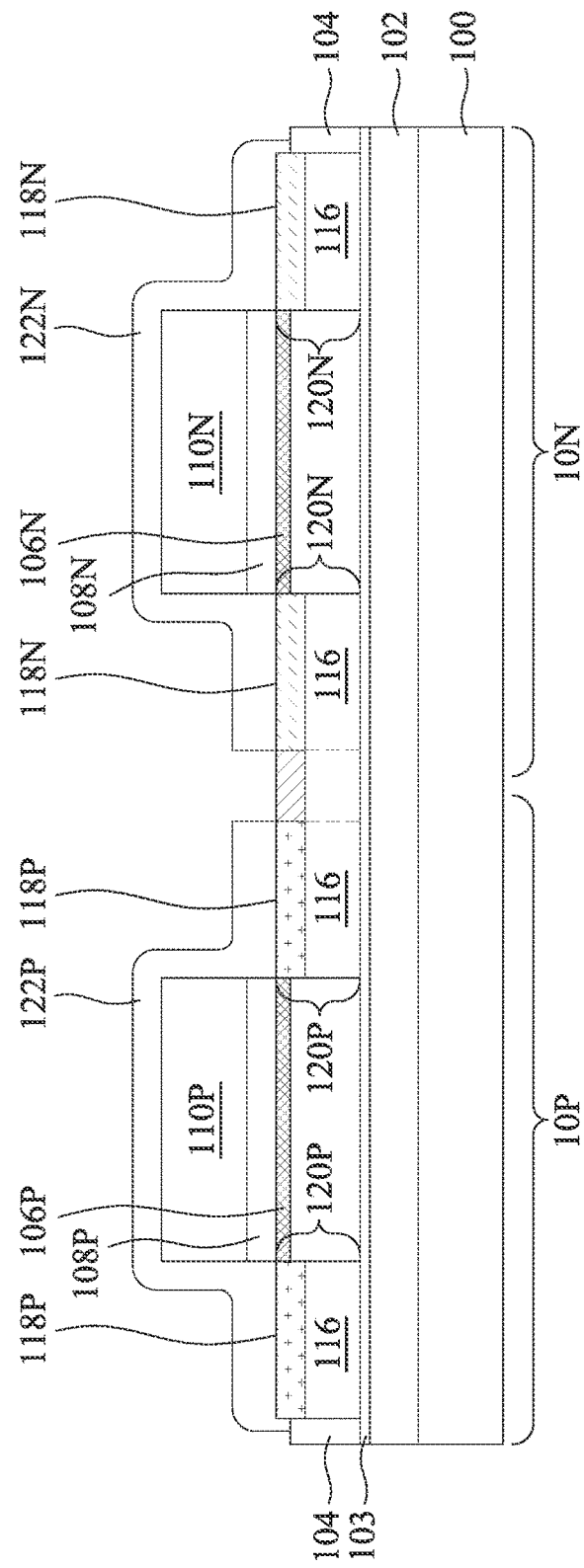

FIGS. 10A and 10B illustrate the formation of low-k doping layers 122P/122N over the source/drain regions 120P/120N, in accordance with some embodiments. The low-k doping layers 122P/122N are formed to provide doping-like effects to the contact layers 118 of the source/drain regions 120P/120N. The use of a low-k doping layer 122P/122N in this manner may improve the conductive properties or contact resistance of the contact layers 118. In the embodiment shown in FIG. 10B, a low-k doping layer 122P is formed over the contact layers 118 and the p-type gate stacks (e.g., the gate electrodes 110P and the gate dielectric layers 108P) in the p-type region 10P and a low-k doping layer 122N is formed over the contact layers 118 and the n-type gate stacks (e.g., the gate electrodes 110N and the gate dielectric layers 108N) in the n-type region 10N. The low-k doping layer 122P provides effective doping to the underlying contact layers 118 to form p-type contact layers 118P, and the low-k doping layer 122N provides effective doping to the underlying contact layers 118 to form n-type contact layers 118N.

In some embodiments, the low-k doping layer 122P may be formed in the p-type region 10P, for example, by first forming a mask, such as a photoresist, over the p-type region 10P and the n-type region 10N and then patterning the mask to expose the contact layers 118P and p-type gate stacks in the p-type region 10P. The low-k doping layer 122P may then be deposited on the exposed contact layers 118P and the gate stacks. The mask may then be removed. Subsequently, another mask, such as a photoresist, may be formed over the p-type region 10P while exposing contact layers 118N and n-type gate stacks in the n-type region 10N. The low-k doping layer 122N may then be deposited on the exposed contact layers 118N and the n-type gate stacks. The mask may then be removed. This is an example, and other process steps are possible, such as forming the low-k doping layer 122N before forming the low-k doping layer 122P. FIGS. 10A-10B show the low-k doping layers 122P and 122N being laterally separated between the p-type region 10P and the n-type region 10N with an undoped portion of the contact layer 118 between the contact layer 118P and the contact layer 118N. In other embodiments, the low-k doping layers 122P and 122N may be contiguous, may physically contact each other, or one may partially cover the other. In other embodiments, a low-k doping layer 122P/122N may be formed in the p-type region 10P but not in the n-type region 10N, or vice versa.

The low-k doping layers 122P/122N may be formed of any suitable materials and may be deposited using any suitable process. The low-k doping layer 122P in the p-type region 10P may comprise one or more materials such as $MoO_3$, $WO_3$, $V_2O_5$, $AuCl_3$, $HAuCl_4$, F4TCNQ, TFSA, $HNO_3$, $NO_2$, the like, or a combination thereof. The low-k doping layer 122N in the n-type region 10N may comprise one or more materials such as silicon nitride, silicon oxide, silicon oxynitride, titanium oxide, aluminum oxide, $Cs_2CO_3$, polyethyleneimine, benzyl viologen, another oxide material, another nitride material, the like, or a combination thereof. These are examples, and the low-k doping layer 122P or the low-k doping layer 122N may comprise other materials or dopants in other embodiments. The low-k doping layers 122P/122N may be formed using any suitable techniques, such as CVD, PVD, ALD, spin-on, evaporation, or the like, or using another technique. In some embodiments, a low-k doping layer may be formed having a thickness in the range of about 0.8 nm to about 100 nm, though other thicknesses are possible.

In some cases, the low-k doping layer 122P/122N provides effective doping to the underlying contact layers 118 spontaneously upon physical contact with the underlying contact layers 118. In other embodiments, an ion implantation process may be performed to implant dopant species into the low-k doping layer 122P/122N and/or the underlying contact layers 118. The parameters of the ion implantation may be controlled to limit or minimize damage to the contact layers 118, in some cases. In some embodiments, an anneal may be performed to facilitate or enhance the doping effects of a low-k doping layer 122P/122N and/or an ion implantation.

In some embodiments, a low-k doping layer 122P/122N may extend conformally on a top surface of a contact layer 118, on a sidewall of a gate dielectric layer 108, and on a sidewall and top surface of a gate electrode 110P/110N. In some embodiments, the low-k doping layer 122P/122N may extend on a sidewall of a semiconductor layer 106. In some cases, the presence of a low-k layer such as the low-k doping layer 122P/122N extending from the contact layer 118 to the gate electrode 110P/110N may reduce parasitic capacitance between the contact layer 118 and the gate electrode 110P/110N. Reducing the parasitic capacitance in this manner can improve device speed, efficiency, and reliability.

Figure 11A:
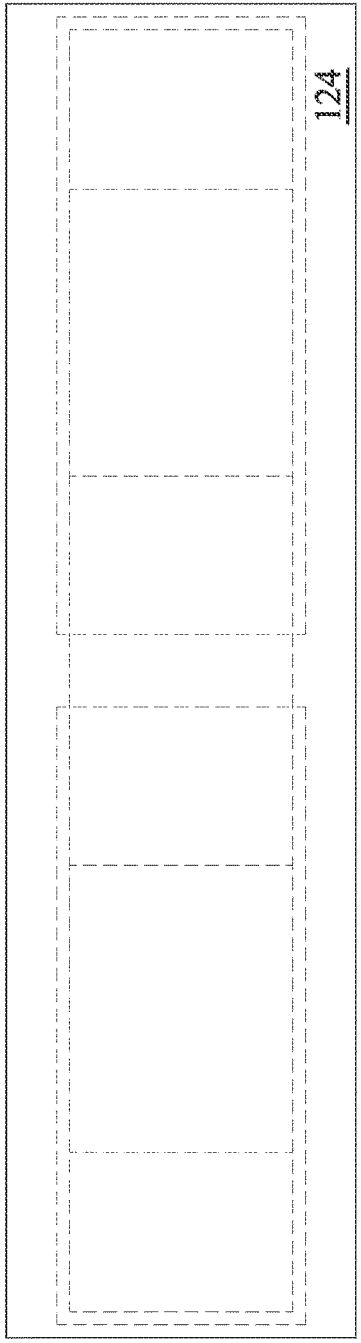
Figure 11B:
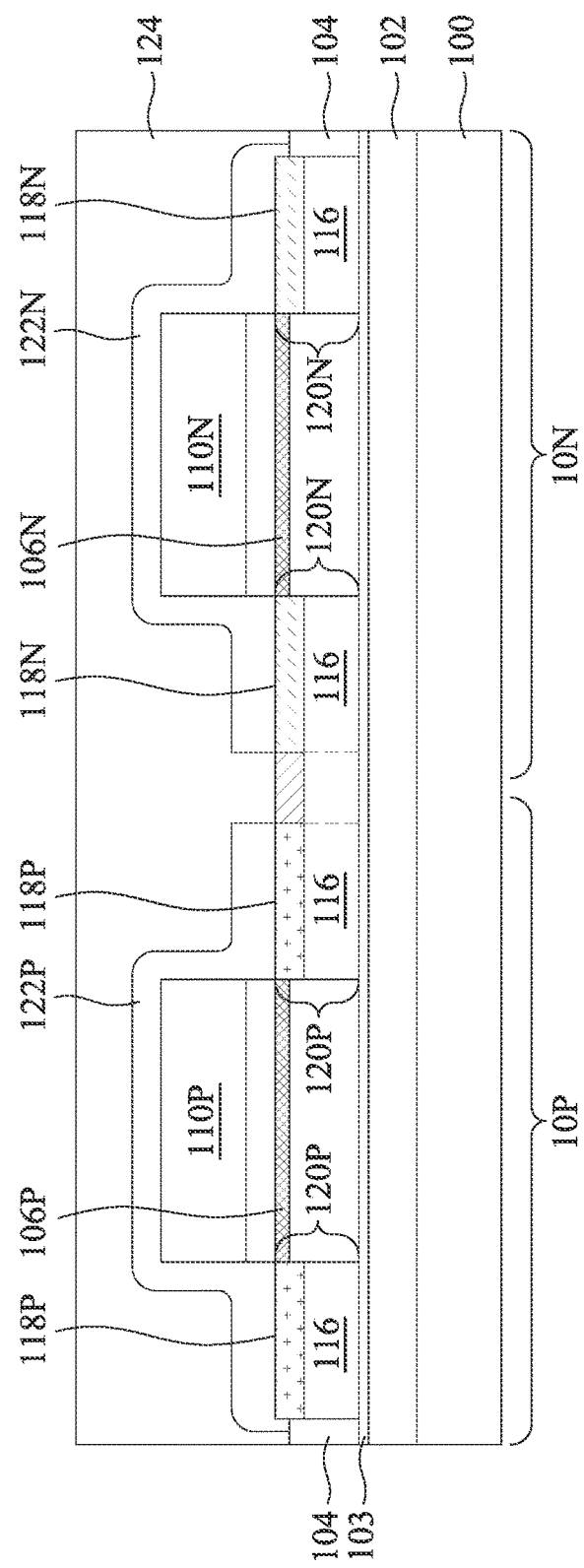

FIGS. 11A and 11B illustrate the formation of a dielectric layer 124 over the low-k doping layer 122P and the low-k doping layer 122N, in accordance with some embodiments. The dielectric layer 124 may comprise a material similar to those described previously for the isolation layer 102 or the isolation layer 104, and may be formed using similar techniques. The dielectric layer 124 may include one layer of material or multiple layers of multiple materials. The dielectric layer 124 may be an ILD or an IMD, in some cases. In some embodiments, a planarization process is performed on the dielectric layer 124 after formation.

Figure 12A:
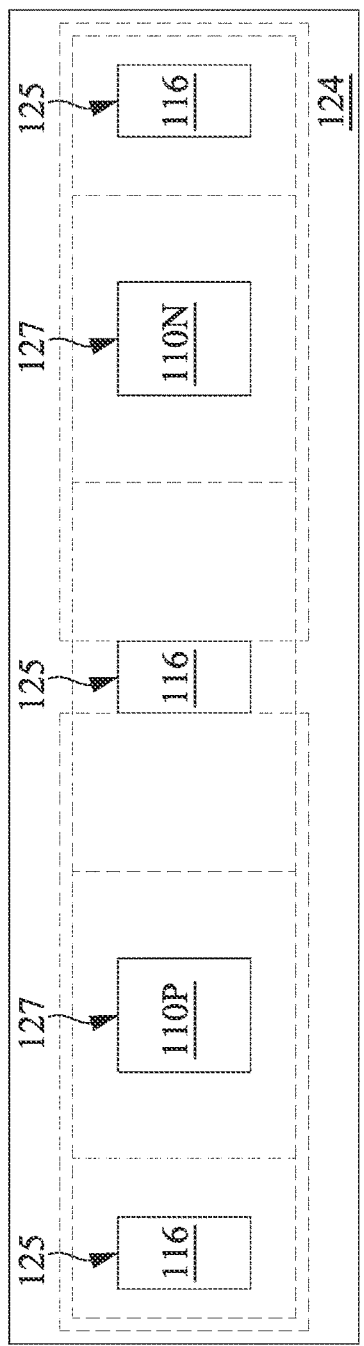
Figure 12B:
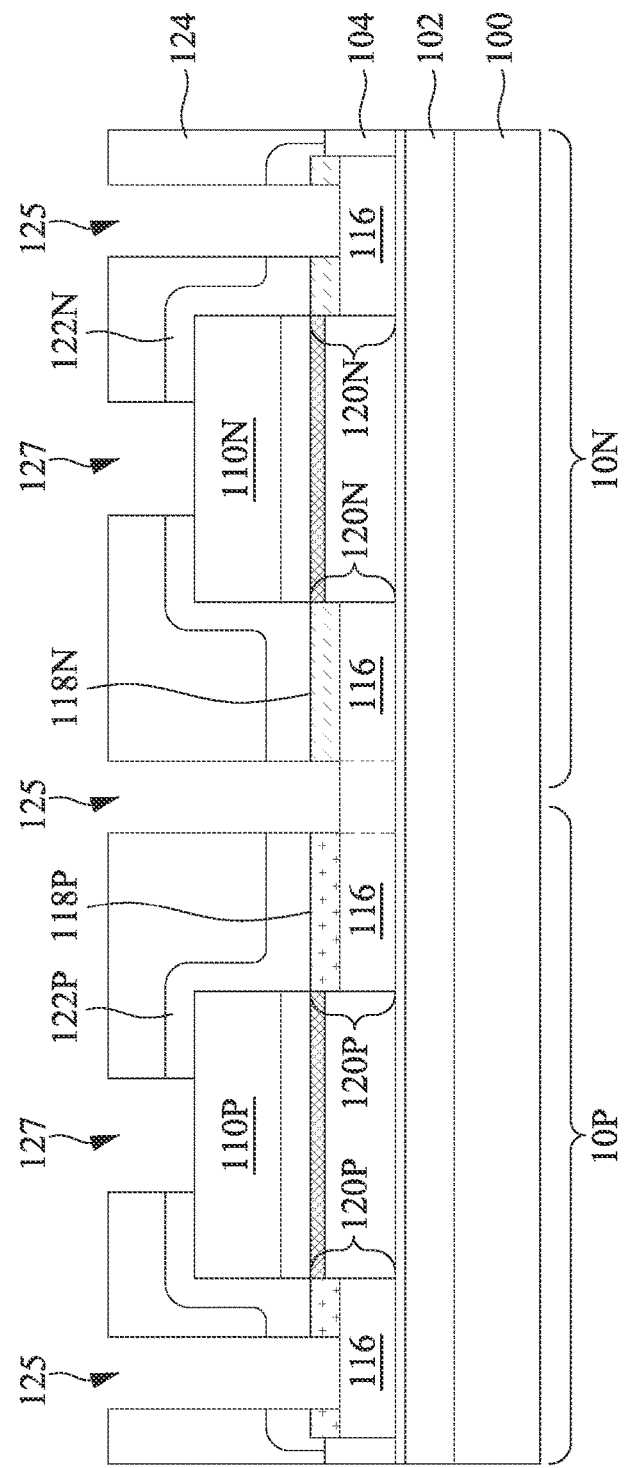

In FIGS. 12A and 12B, contact openings 125 and 127 are formed, in accordance with some embodiments. The contact openings 125 are formed through the dielectric layer 124, low-k doping layers 122P/122N, and contact layers 118 for subsequently formed source/drain contacts 126 (see FIGS. 13A-13B). The contact openings 125 may extend through the contact layers 118 and expose the source/drain metal 116, in some embodiments. The contact openings 127 are formed through the dielectric layer 124 and low-k doping layers 122P/122N for subsequently formed gate contacts 128 (see FIGS. 13A-13B). The contact openings 127 may expose the gate electrodes 110P/110N, in some embodiments. The contact openings 125 and 127 may be formed using acceptable photolithography and etching techniques. The contact openings 125 and 127 may be formed in different processes, or may be formed in the same process.

Figure 13A:
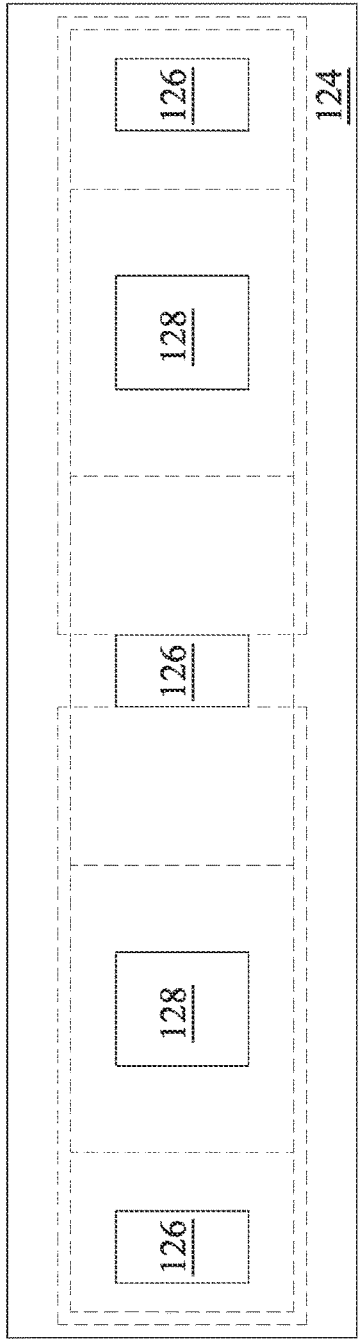
Figure 13B:
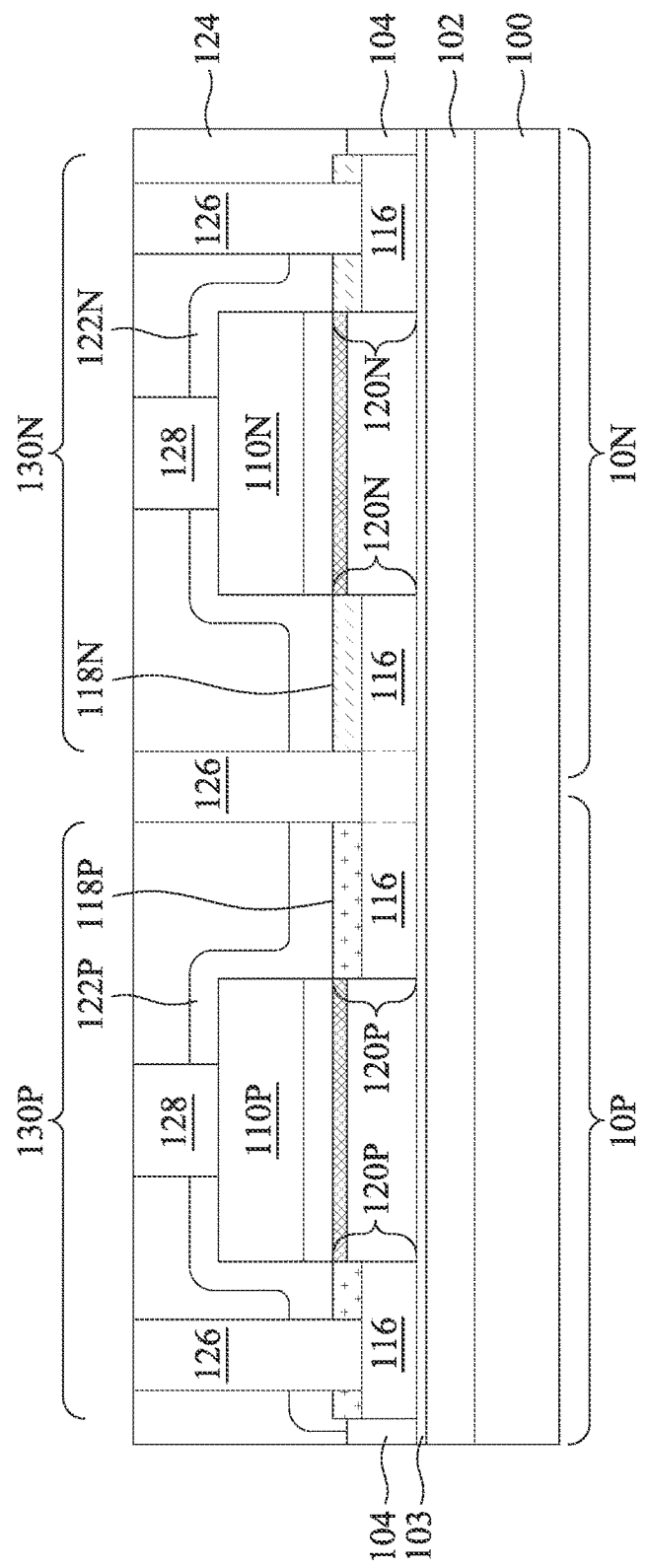

In FIGS. 13A and 13B, source/drain contacts 126 are formed in the contact openings 125 and gate contacts 128 are formed in the contact openings 127, in accordance with some embodiments. In some embodiments, an optional liner (not shown), such as a diffusion barrier layer, an adhesion layer, or the like, and a conductive material are formed in the openings 125/127. The liner may include titanium, titanium nitride, tantalum, tantalum nitride, or the like. The conductive material may be copper, a copper alloy, silver, gold, tungsten, cobalt, aluminum, nickel, the like, or a combination thereof. A planarization process, such as a CMP, may be performed to remove excess material from a surface of the dielectric layer 124. The remaining liner and conductive material form the source/drain contacts 126 and gate contacts 128 in the openings 125/127. The source/drain contacts 126 are physically and electrically coupled to the source/drain regions 120P/120N. In some embodiments, a source/drain contact 126 may physically and electrically contact a top surface of the source/drain metal 116 and a sidewall surface of the contact layer 118. The gate contacts 128 are physically and electrically coupled to the gate electrodes 110P/110N. The source/drain contacts 126 and gate contacts 128 may be formed in different processes, or may be formed in the same process. Although shown as being formed in the same cross-sections, it should be appreciated that each of the source/drain contacts 126 and gate contacts 128 may be formed in different cross-sections, which may avoid shorting of the contacts.

In this manner, transistor device may be formed comprising a p-type transistor 130P having a low-dimensional channel layer 106P and an n-type transistor 130N having a low-dimensional channel layer 106N. A p-type transistor 130P may be formed in the p-type region 10P and an n-type transistor 130N may be formed in the n-type region 10N. In some embodiments, the p-type transistor 130P and the n-type transistor 130N form a Complementary Metal-Oxide-Semiconductor (CMOS) transistor device, with the p-type transistor 130P being a PMOS device and the n-type transistor 130N being an NMOS device. For example, in the embodiment shown in FIGS. 13A-13B, a single source/drain contact 126 may contact both a source/drain region 120P of the p-type transistor 130P and a source/drain region 120N of the n-type transistor 130N. In other embodiments, p-type transistors 130P and n-type transistors 130N may be arranged and connected in other configurations. For example, a p-type transistor 130P or an n-type transistor 130N may be separated from other transistors or may have dedicated source/drain contacts 126. Examples of an isolated p-type transistor 130P and an isolated n-type transistor 130N are described below for FIGS. 13A through 21B.

Figure 14A:
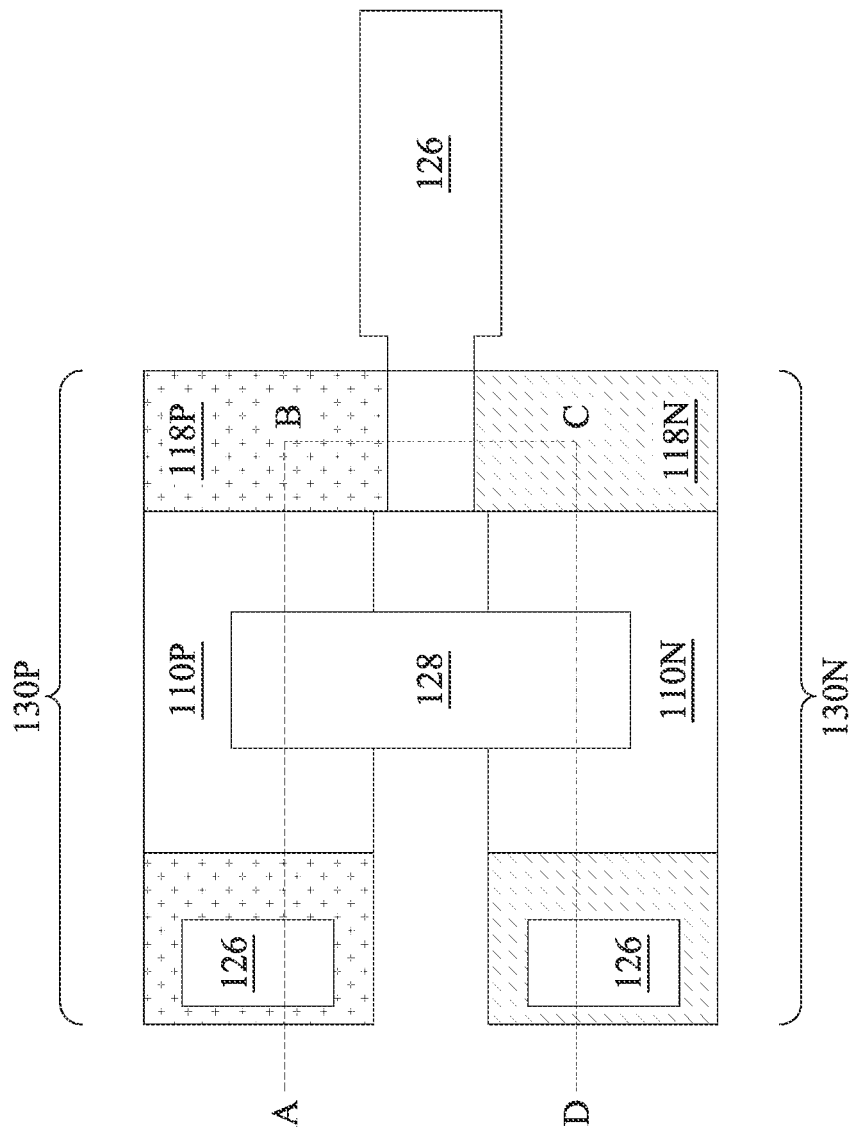
FIGS. 14A and 14B illustrate a top view and a cross-sectional view of an intermediate stage in the formation of a transistor device, in accordance with some embodiments.
Figure 14B:
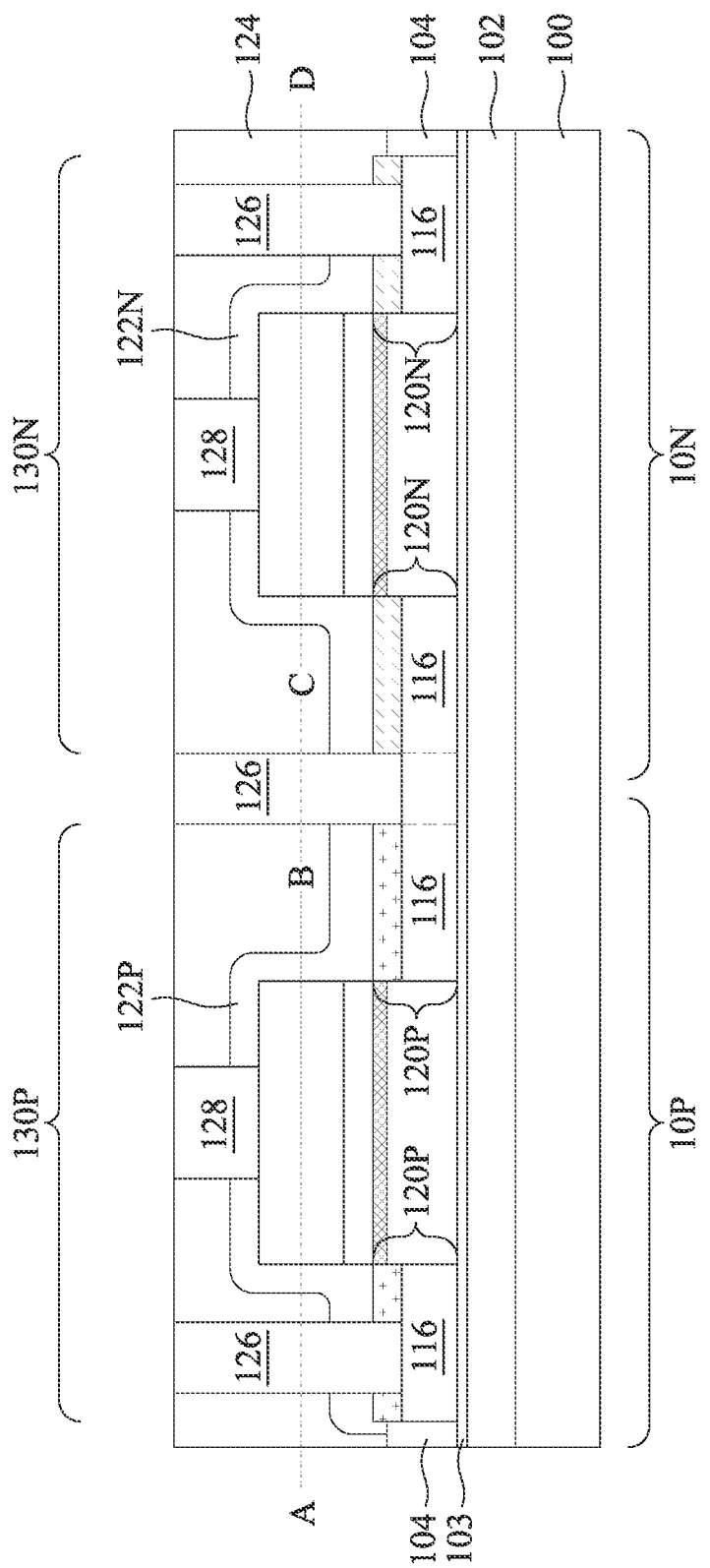

Further, the layout of the p-type transistor 130P and the n-type transistor 130N may be different than shown in FIG. 13A. As a non-limiting example, FIGS. 14A and 14B illustrate a p-type transistor 130P and an n-type transistor 130N that are similar to those shown in FIGS. 13A-13B, except that the transistors 130P and 130N are arranged in a "U-shaped" layout rather than in a linear layout. For clarity, some labels and features have been omitted in FIGS. 14A-14B. FIG. 14B is illustrated along the piecewise cross-section ABCD shown in FIG. 14A, with corresponding locations A, B, C, and D labeled in FIG. 14B for reference. Other layouts, arrangements, or configurations are possible.

Figure 15:
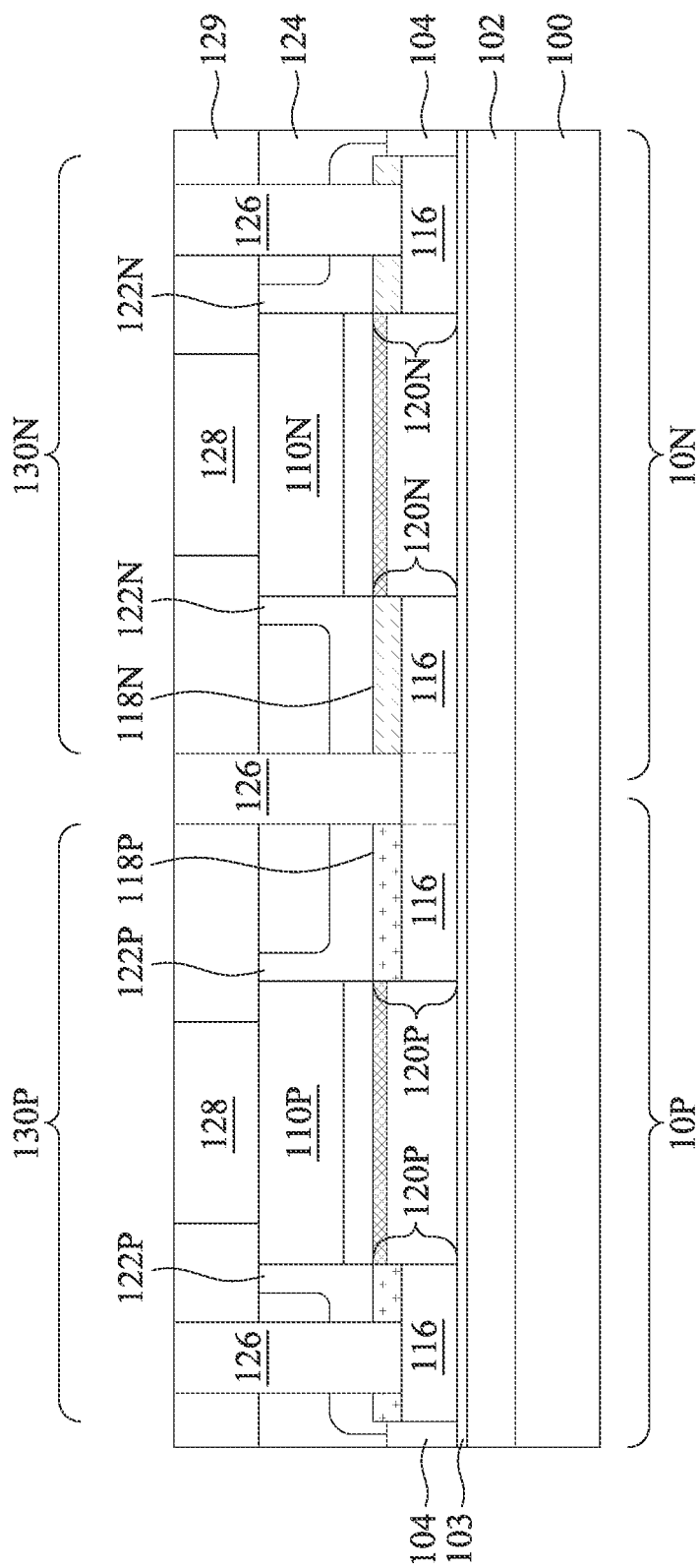
FIG. 15 illustrates a cross-sectional view of an intermediate stage in the formation of a transistor device, in accordance with some embodiments.

A p-type transistor 130P or an n-type transistor 130N may be formed having different process steps than described in FIGS. 1A through 13B. As a non-limiting example, FIG. 15 illustrates a p-type transistor 130P and an n-type transistor 130N, in accordance with some embodiments. The transistors 130P/130N of FIG. 15 are similar to the transistors 130P/130N shown in FIGS. 13A-13B, except that the low-k doping layers 122P/122N have been removed from top surfaces of the gate electrodes 110P/110N. For example, after forming the dielectric layer 124 as shown in FIGS. 11A-11B, a planarization process may be performed to remove the low-k doping layers 122P/122N from top surfaces of the gate electrodes 110P/110N. After the planarization process, top surfaces of the low-k doping layers 122P/122N, top surfaces of the gate electrodes 110P/110N, and top surfaces of the dielectric layer 124 may be level. A dielectric layer 129 may then be deposited over the low-k doping layers 122P/122N, the gate electrodes 110P/110N, and the dielectric layer 124. The dielectric layer 129 may be similar to the dielectric layer 124, and may be formed using similar techniques. A planarization process may be performed on the dielectric layer 129, in some embodiments. Source/drain contacts 126 and gate contacts 128 may then be formed using a suitable technique, such as those described previously.

Figure 16:
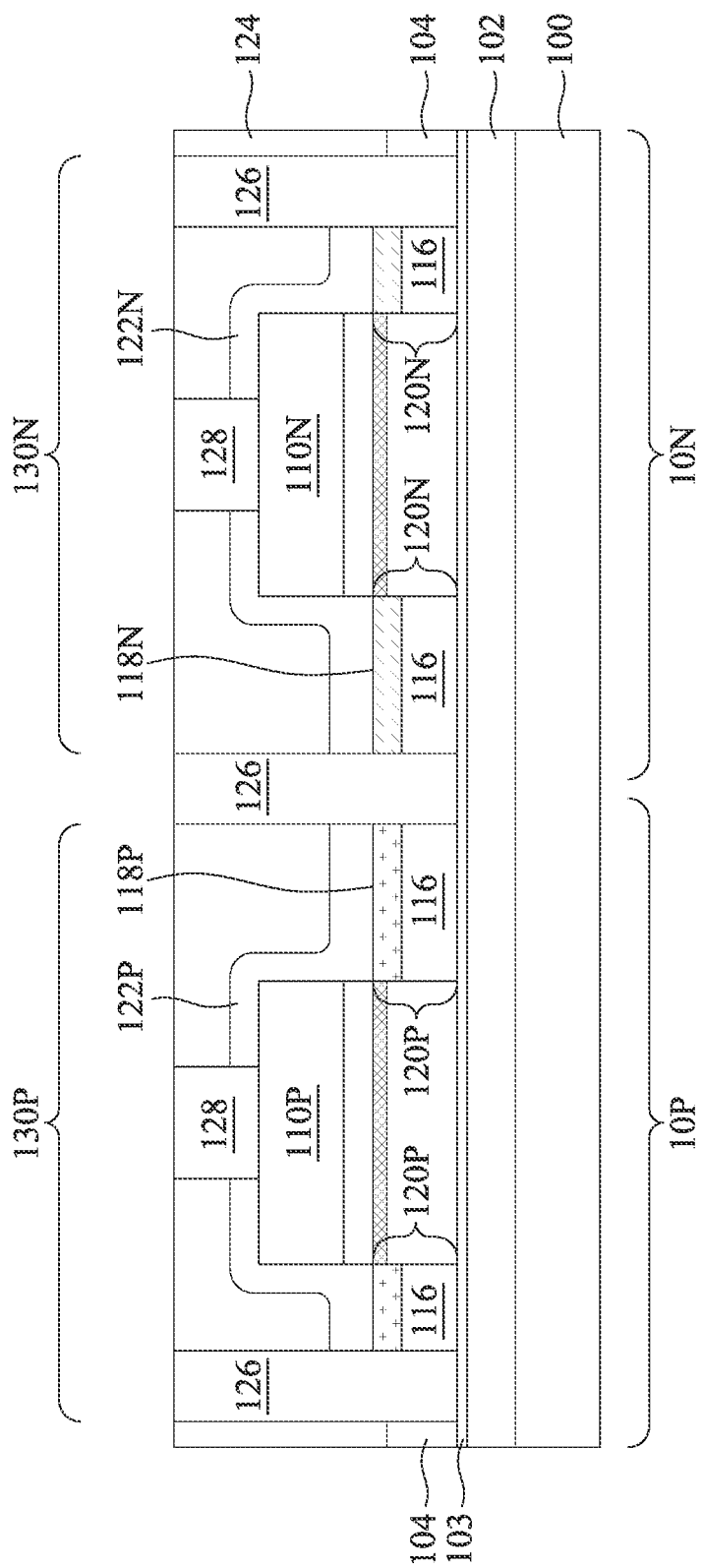
FIG. 16 illustrates a cross-sectional view of an intermediate stage in the formation of a transistor device, in accordance with some embodiments.

As another non-limiting example, FIG. 16 illustrates a p-type transistor 130P and an n-type transistor 130N, in accordance with some embodiments. The transistors 130P/130N of FIG. 16 are similar to the transistors 130P/130N shown in FIGS. 13A-13B, except that the source/drain contacts 126 extend through the isolation layer 104 and contact the sidewalls of the source/drain regions 120P/120N. The source/drain contacts 126 of FIG. 16 may be formed similarly to the source/drain contacts 126 of FIGS. 13A-13B, except that the contact openings 125 (see FIGS. 12A-12B) extend below a top surface of the source/drain metal 116. In this manner, the source/drain contacts 126 may physically and electrically contact the sidewall of the source/drain metal 116 rather than the top surface of the source/drain metal 116. In some embodiments, the contact openings 125 may expose the etch stop layer 103, and thus the source/drain contacts 126 are formed on the etch stop layer 103. Forming the contact openings 125 may include etching the source/drain regions 120P/120N and/or etching the isolation layer 104. For example, in some embodiments, the source/drain region 120P and the source/drain region 120N may be separated by a region of isolation layer 104 that is removed during etching of the contact openings 125 to expose sidewalls of the source/drain region 120P and the source/drain region 120N. In some embodiments, a selective etch may be used to selectively remove material of the source/drain regions 120P/120N or selectively remove material of the isolation layer 104. In other embodiments, the source/drain contacts 126 may physically and electrically contact both the sidewall and the top surface of the source/drain metal 116.

Figure 17A:
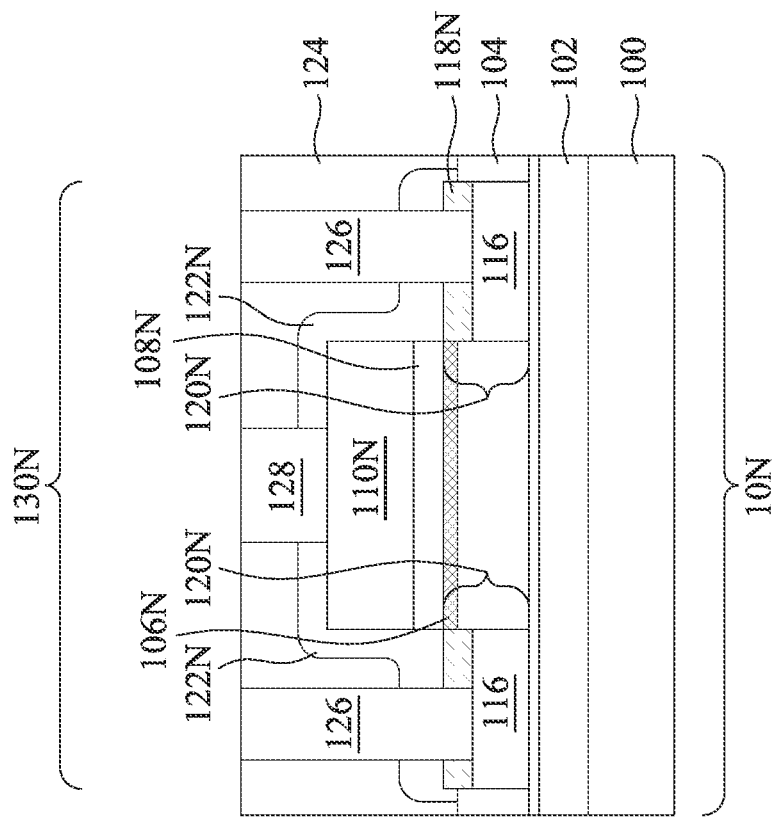
FIGS. 17A and 17B illustrate cross-sectional views of an intermediate stage in the formation of a p-type transistor and an n-type transistor, in accordance with some embodiments
Figure 17B:
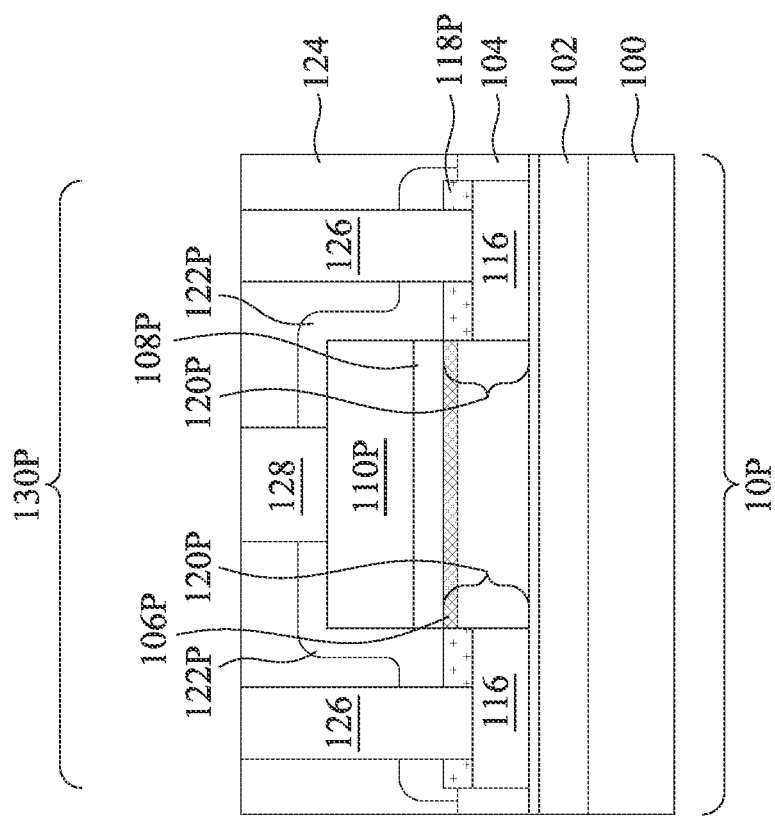

While the embodiments of FIGS. 13A through 16 describe a p-type transistor 130P that is connected to an n-type transistor 130N, in other embodiments, p-type transistors 130P or n-type transistors 130N may be formed in isolation. As non-limiting examples, FIG. 17A illustrates a cross-sectional view of an isolated p-type transistor 130P and FIG. 17B illustrates a cross-sectional view of an isolated n-type transistor 130N, in accordance with some embodiments. The transistors 130P/130N shown in FIGS. 17A-17B are similar to those shown previously (e.g., in FIGS. 13A-13B), and may be formed using similar techniques. FIGS. 18A through 21B illustrate various embodiments of isolated transistors 130P/130N. Some of the features described for the embodiments of FIGS. 18A-21B may be applied to other embodiments described herein, such as those described for FIGS. 13A-13B or the like.

Figure 18A:
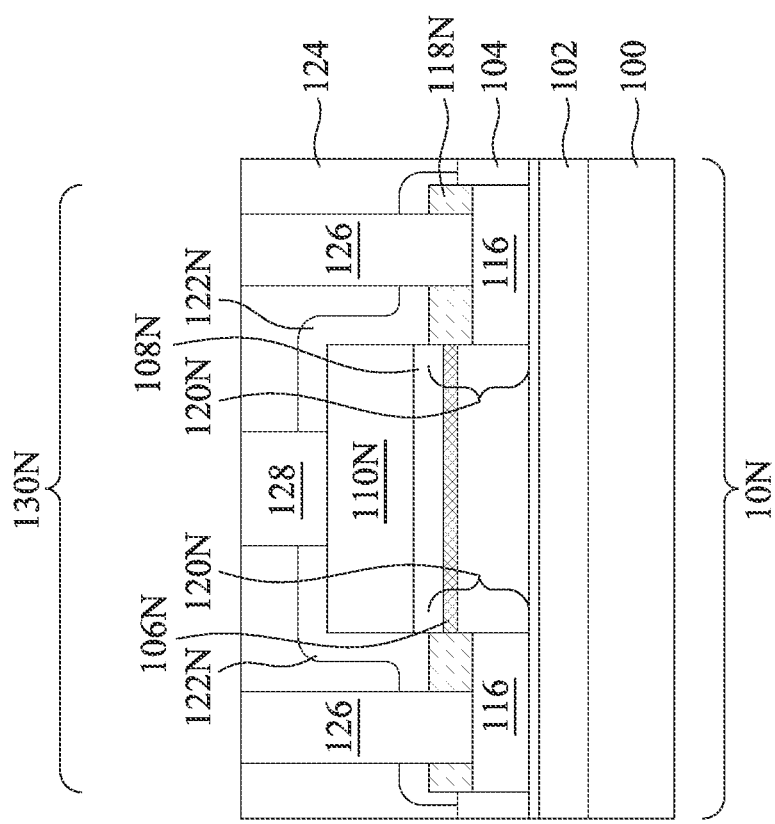
FIGS. 18A and 18B illustrate cross-sectional views of an intermediate stage in the formation of a p-type transistor and an n-type transistor, in accordance with some embodiments
Figure 18B:
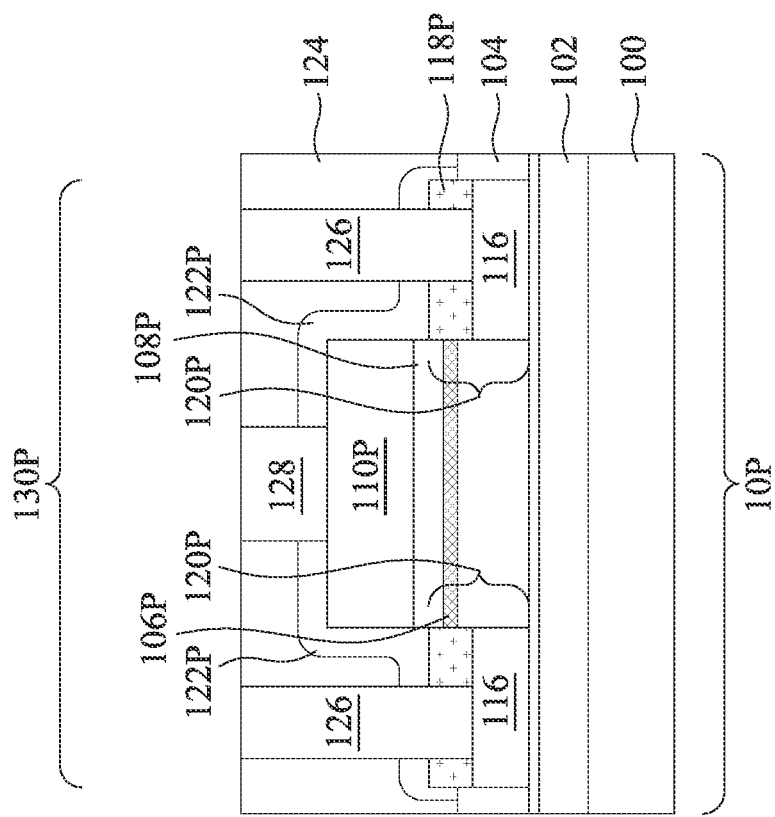

FIGS. 18A and 18B illustrate cross-sectional views of a p-type transistor 130P and an n-type transistor 130N, in accordance with some embodiments. The transistors 130P/130N are similar to the transistors 130P/130N described previously for FIGS. 17A-17B, except a top surface of the contact layer 118 is higher than a top surface of the semiconductor layer 106. For example, a top surface of the contact layer 118 is higher than a bottom surface of the gate dielectric layer 108 but lower than a top surface of the gate dielectric layer 108. By forming a contact layer 118 that extends from below a bottom surface of the semiconductor layer 106 to above a top surface of the semiconductor layer 106, the contact area between the sidewall of the semiconductor layer 106 and the sidewall of the contact layer 118 can be maximized. Additionally, forming a contact layer 118 in this manner can help ensure full sidewall contact between the semiconductor layer 106 and the contact layer 118 when process variations may be present.

Figure 19A:
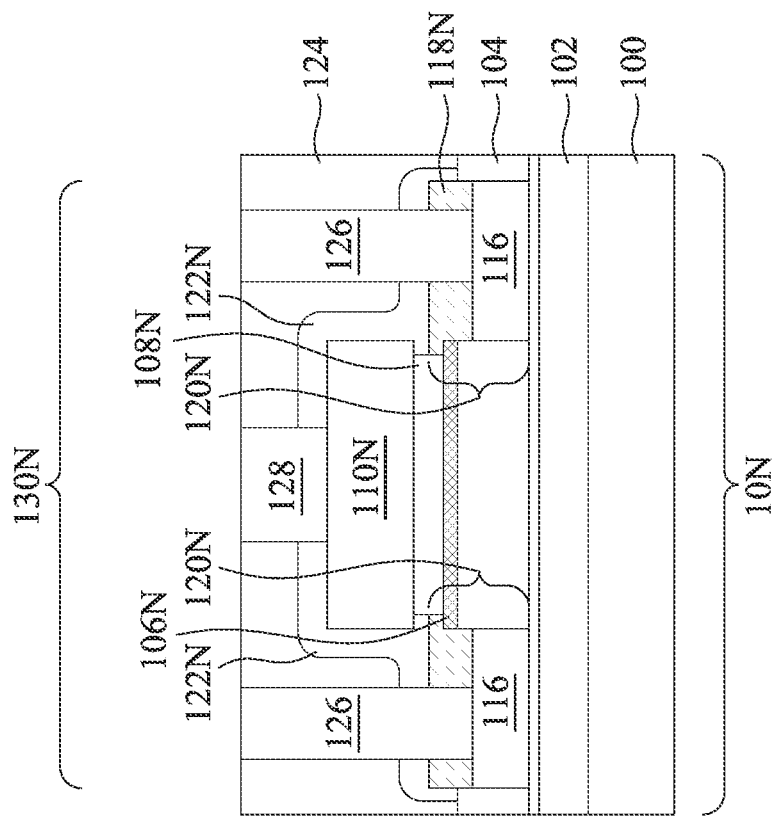
FIGS. 19A and 19B illustrate cross-sectional views of an intermediate stage in the formation of a p-type transistor and an n-type transistor, in accordance with some embodiments
Figure 19B:
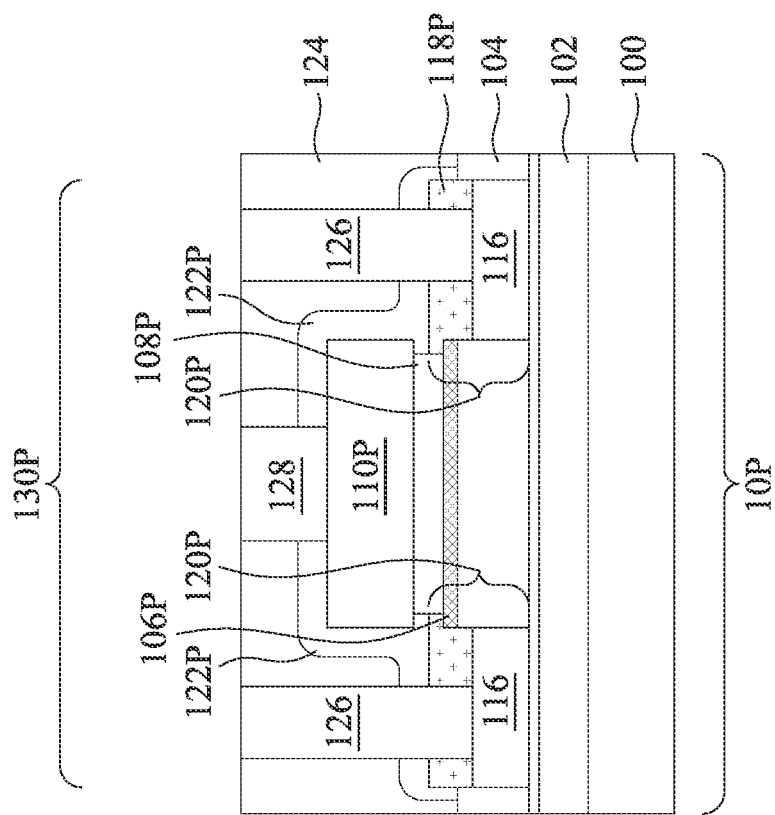

FIGS. 19A and 19B illustrate cross-sectional views of a p-type transistor 130P and an n-type transistor 130N, in accordance with some embodiments. The transistors 130P/130N are similar to the transistors 130P/130N described previously for FIGS. 17A-17B, except that the gate dielectric layer 108 has been laterally recessed to allow the contact layer 118 to physically and electrically contact a top surface of the semiconductor layer 106 in addition to a sidewall of the semiconductor layer 106. The sidewalls of the gate dielectric layer 108 may be recessed using a suitable etching technique and at any suitable process step. For example, during the patterning of the gate stacks described for FIGS. 4A-4B, the gate dielectric layer 108 may be recessed by overetching the gate dielectric layer 108, by etching the gate dielectric layer 108 using a relatively isotropic etch, or by selectively etching sidewalls of the gate dielectric layer 108. These are examples, and the gate dielectric layer 108 may be recessed using other techniques and/or at a different step in the manufacture of transistors 130P/130N. In some embodiments, the sidewalls of the gate dielectric layer 108 may be recessed a lateral distance that is in the range of about 0.1 nm to about 10 nm, though other distances are possible. The recessed sidewalls of the gate dielectric layer 108 may have a substantially vertical profile, a flat profile, a concave profile, or have an irregular profile. In some embodiments, recessing the gate dielectric layer 108 may allow the low-k doping layer 122P/122N to be deposited under the gate electrode 110P/110N, as shown in FIGS. 19A-19B. In other embodiments, a portion of the gate dielectric layer 108 may extend over a top surface of the contact layer 118. In some cases, electrically contacting a semiconductor layer 106 at both a top surface and a sidewall can decrease contact resistance.

Figure 20A:
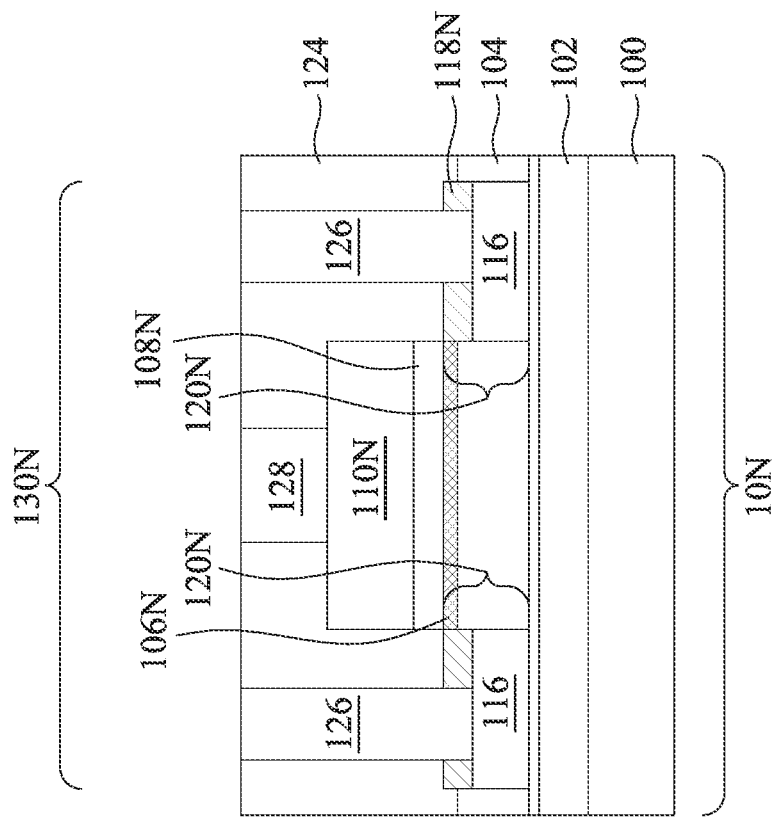
FIGS. 20A and 20B illustrate cross-sectional views of an intermediate stage in the formation of a p-type transistor and an n-type transistor, in accordance with some embodiments.
Figure 20B:
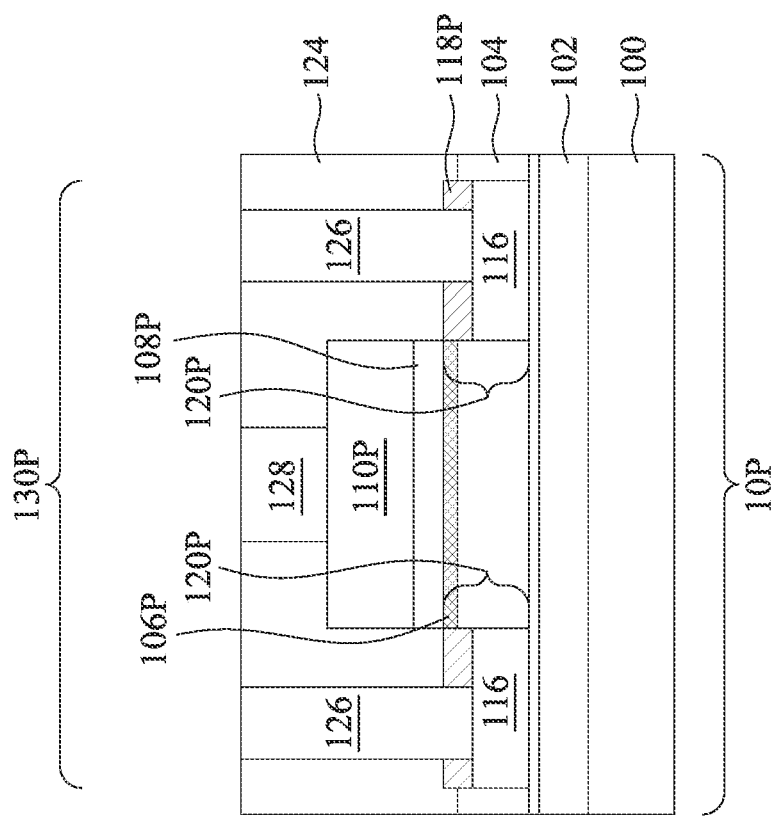
Figure 21A:
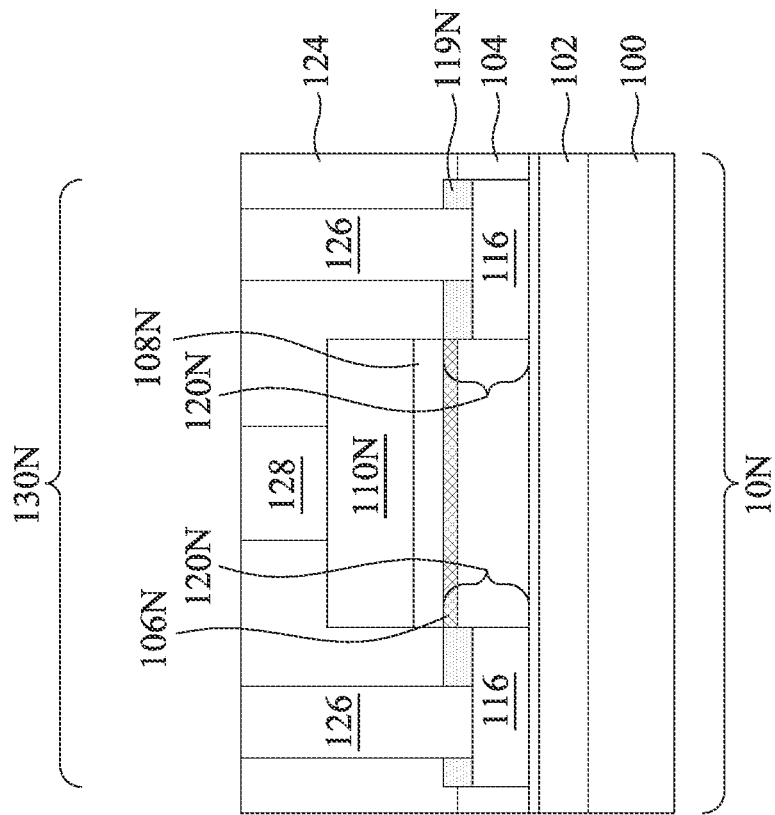
FIGS. 21A and 21B illustrate cross-sectional views of an intermediate stage in the formation of a p-type transistor and an n-type transistor, in accordance with some embodiments.
Figure 21B:
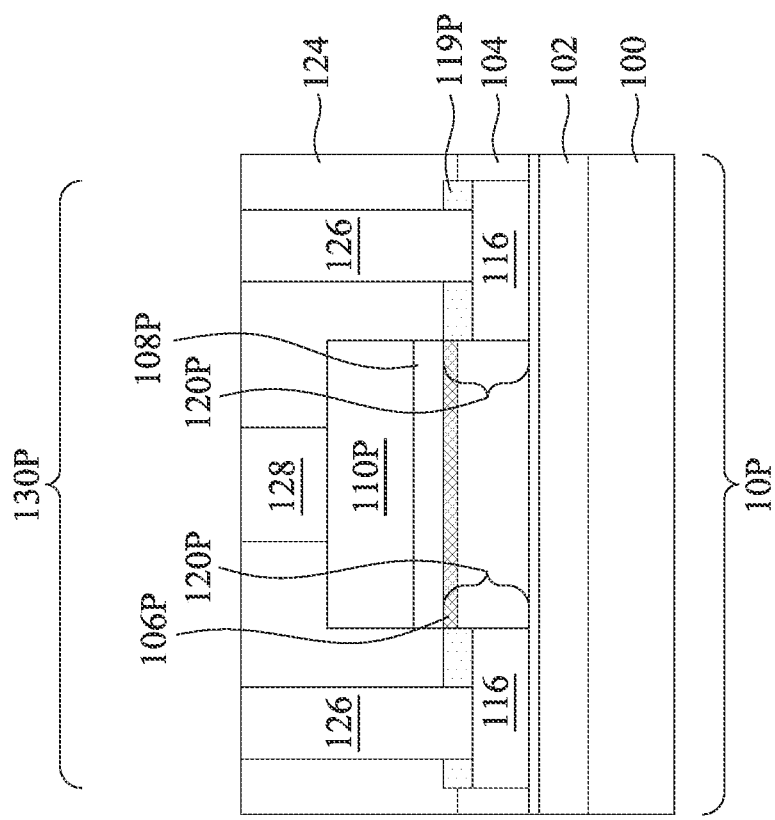

FIGS. 20A and 20B illustrate cross-sectional views of a p-type transistor 130P and an n-type transistor 130N, in accordance with some embodiments. The transistors 130P/130N are similar to the transistors 130P/130N described previously for FIGS. 17A-17B, except that a low-k doping layer 122P/122N is not formed. For example, in some cases, the 2D contact layer 118 may be sufficiently conductive that a low-k doping layer 122P/122N is not required. This is an example, and a low-k doping layer 122P/122N may be omitted for other reasons. In some embodiments, a low-k doping layer 122P/122N may be omitted from only the p-type transistor 130P or only the n-type transistor 130N.

FIGS. 21A and 21B illustrate cross-sectional views of a p-type transistor 130P and an n-type transistor 130N, in accordance with some embodiments. The transistors 130P/130N are similar to the transistors 130P/130N described previously for FIGS. 17A-17B, except that the contact layer 119P/119N comprising a non-2D material is used instead of a contact layer 118 comprising a 2D material. The contact layer 119P/119N may comprise highly conductive material that makes physical and electrical contact to a sidewall of a semiconductor layer 106. For example, the contact layer 119P/119N may comprise a metal or metal alloy such as platinum, PtIn, PtBi, PtSb, another platinum alloy, another metal, the like, or a combination thereof. In some embodiments, the metal or metal alloy may be doped to provide improved electrical connection to the semiconductor layer 106. For example, the metal or metal alloy may be doped with sulfur or selenium, though other dopants are possible. In other embodiments, the contact layer 119P/119N may comprise a conductive non-metal material, such as graphene or the like, which may be doped or undoped. The contact layer 119P in the p-type region 10P may be the same or different from the contact layer 119N in the n-type region 10N. The contact layer 119P/119N may be deposited using any suitable process. In other embodiments, a low-k doping layer 122P/122N may be formed on the contact layer 119P/119N.

The embodiments of the present disclosure have some advantageous features. By forming source/drain regions with a contact layer that electrically contacts the side of a 2D channel layer, effects such as Fermi-level pinning can be reduced or eliminated. This can reduce the contact resistance between the source/drain regions and the 2D channel, which can improve device performance, improve device efficiency, or reduce device power consumption. The techniques described herein allow for formation of source/drain regions using a self-aligned process, which can improve device design flexibility, improve process design flexibility, or improve yield. The techniques described herein can also allow for the formation of high work-function contacts. Additionally, the source/drain regions may be formed without depositing temporary materials such as photoresists on the 2D channel material, which can reduce the chance of damage to the 2D channel and reduce the chance of residue remaining on the 2D channel. This can improve device yield and reliability. The techniques described herein allow for various doping techniques for the contact layer, such as the use of a doping layer. In some cases, the use of a doping layer can also reduce parasitic capacitance between the gate electrode and the source/drain region, which can improve device speed and performance. The techniques described herein also allow for the formation of complimentary (e.g., CMOS) devices.

In accordance with some embodiments of the present disclosure, a device includes a first source/drain region including: a first metal layer including a first metal; and a conductive two-dimensional material on the first metal layer; an isolation layer physically contacting a sidewall of the first metal layer, wherein the conductive two-dimensional material protrudes above the isolation layer; a two-dimensional semiconductor material on the isolation layer, wherein a sidewall of the two-dimensional semiconductor material physically contacts a sidewall of the conductive two-dimensional material; and a gate stack on the two-dimensional semiconductor material. In an embodiment, the device includes a doping layer extending on the conductive two-dimensional material and on the gate stack, wherein the doping layer provides a doping effect to the conductive two-dimensional material. In an embodiment, the doping layer includes an oxide. In an embodiment, top surfaces of the two-dimensional semiconductor material are free of the conductive two-dimensional material. In an embodiment, the conductive two-dimensional material includes the first metal. In an embodiment, the first metal is a transition metal. In an embodiment, the two-dimensional semiconductor material includes a transition metal dichalcogenide. In an embodiment, the conductive two-dimensional material protrudes above the two-dimensional semiconductor material.

In accordance with some embodiments of the present disclosure, a device includes a first transistor including: a first drain region including a first two-dimensional (2D) contact material over a first metal material; a first source region including the first 2D contact material over the first metal material; a first 2D channel material extending from the first drain region to the first source region, wherein the first 2D channel material physically contacts a sidewall of the first 2D contact material of the first drain region and a sidewall of the first 2D contact material of the first source region; a first gate dielectric material on the first 2D channel material; a first gate electrode material on the first gate dielectric material; and a first doping layer extending on the first drain region, the first source region, the first gate dielectric material, and the first gate electrode material. In an embodiment, the device includes a second transistor adjacent the first transistor, wherein the second transistor includes: a second drain region including a second 2D contact material over a second metal material; a second source region including the second 2D contact material over the second metal material; a second 2D channel material extending from the second drain region to the second source region, wherein the second 2D channel material physically contacts a sidewall of the second 2D contact material of the second drain region and a sidewall of the second 2D contact material of the second source region; a second gate dielectric material on the second 2D channel material; a second gate electrode material on the second gate dielectric material; and a second doping layer extending on the second drain region, the second source region, the second gate dielectric material, and the second gate electrode material. In an embodiment, the first transistor is p-type and the second transistor is n-type. In an embodiment, the first drain region physically and electrically contacts the second drain region. In an embodiment, the first 2D channel material and the second 2D channel material include the same material. In an embodiment, the first drain region is adjacent the second drain region, the first source region is adjacent the second source region, and the device includes a gate contact that physically and electrically contacts the first gate electrode material and the second gate electrode material. In an embodiment, the first 2D contact material physically contacts a top surface of the first 2D channel material. In an embodiment, the device includes a source/drain contact extending through the first 2D contact material to physically contact the first metal material.

In accordance with some embodiments of the present disclosure, a method includes forming a low-dimensional semiconductor layer on an isolation layer; forming a gate structure on the low-dimensional semiconductor layer; forming an opening in the isolation layer adjacent the low-dimensional semiconductor layer; depositing a metal material in the opening; forming a low-dimensional contact layer on the metal material, wherein a sidewall of the low-dimensional contact layer physically and electrically contacts a sidewall of the low-dimensional semiconductor layer; and depositing a doping layer over the low-dimensional contact layer and the gate structure. In an embodiment, forming the low-dimensional contact layer includes performing a sulfurization process or a selenization process on the metal material. In an embodiment, forming the low-dimensional contact layer consumes an upper portion of the metal material. In an embodiment, the method includes forming a gate contact extending through the doping layer to physically and electrically contact the gate structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A device comprising:
a first source/drain region comprising:
a first metal layer comprising a first metal; and
a conductive two-dimensional material on the first metal layer;
an isolation layer physically contacting a sidewall of the first metal layer, wherein the conductive two-dimensional material protrudes above the isolation layer;
a two-dimensional semiconductor material on the isolation layer, wherein a sidewall of the two-dimensional semiconductor material physically contacts a sidewall of the conductive two-dimensional material; and a gate stack on the two-dimensional semiconductor material.

2. The device of claim 1 further comprising a doping layer extending on the conductive two-dimensional material and on the gate stack, wherein the doping layer provides a doping effect to the conductive two-dimensional material.

3. The device of claim 2, wherein the doping layer comprises an oxide.

4. The device of claim 1, wherein top surfaces of the two-dimensional semiconductor material are free of the conductive two-dimensional material.

5. The device of claim 1, wherein the conductive two-dimensional material comprises the first metal.

6. The device of claim 5, wherein the first metal is a transition metal.

7. The device of claim 1, wherein the two-dimensional semiconductor material comprises a transition metal dichalcogenide.

8. The device of claim 1, wherein the conductive two-dimensional material protrudes above the two-dimensional semiconductor material.

9. A device comprising:
a first transistor comprising:
a first drain region comprising a first two-dimensional (2D) contact material over a first metal material;
a first source region comprising the first 2D contact material over the first metal material;
a first 2D channel material extending from the first drain region to the first source region, wherein the first 2D channel material physically contacts a sidewall of the first 2D contact material of the first drain region and a sidewall of the first 2D contact material of the first source region;
a first gate dielectric material on the first 2D channel material;
a first gate electrode material on the first gate dielectric material; and
a first doping layer extending on the first drain region, the first source region, the first gate dielectric material, and the first gate electrode material.

10. The device of claim 9 further comprising a second transistor adjacent the first transistor, wherein the second transistor comprises:
a second drain region comprising a second 2D contact material over a second metal material;
a second source region comprising the second 2D contact material over the second metal material;
a second 2D channel material extending from the second drain region to the second source region, wherein the second 2D channel material physically contacts a sidewall of the second 2D contact material of the second drain region and a sidewall of the second 2D contact material of the second source region;
a second gate dielectric material on the second 2D channel material;
a second gate electrode material on the second gate dielectric material; and
a second doping layer extending on the second drain region, the second source region, the second gate dielectric material, and the second gate electrode material.

11. The device of claim 10, wherein the first transistor is p-type and the second transistor is n-type.

12. The device of claim 10, wherein the first drain region physically and electrically contacts the second drain region.

13. The device of claim 10, wherein the first 2D channel material and the second 2D channel material comprise the same material.

14. The device of claim 10, wherein the first drain region is adjacent the second drain region, wherein the first source region is adjacent the second source region, and further comprising a gate contact that physically and electrically contacts the first gate electrode material and the second gate electrode material.

15. The device of claim 9, wherein the first 2D contact material physically contacts a top surface of the first 2D channel material.

16. The device of claim 9 further comprising a source/drain contact extending through the first 2D contact material to physically contact the first metal material.

17. A device comprising:
a low-dimensional semiconductor layer on an isolation layer;
a gate structure on the low-dimensional semiconductor layer;
a metal material in the isolation layer adjacent the low-dimensional semiconductor layer;
a low-dimensional contact layer on the metal material, wherein a sidewall of the low-dimensional contact layer physically and electrically contacts a sidewall of the low-dimensional semiconductor layer; and
a doping layer over the low-dimensional contact layer and the gate structure.

18. The device of claim 17, wherein an upper portion of the metal material comprises sulfur or selenium.

19. The device of claim 17 further comprising a source/drain contact extending through the doping layer and the low-dimensional contact layer to the metal material.

20. The device of claim 17 further comprising a gate contact extending through the doping layer that physically and electrically contacts the gate structure.

* * * * *